(12) United States Patent
Maruyama et al.

(10) Patent No.: US 7,048,798 B2
(45) Date of Patent: May 23, 2006

(54) SILICON CARBIDE SINGLE CRYSTAL AND METHOD AND APPARATUS FOR PRODUCING THE SAME

(75) Inventors: Takayuki Maruyama, Kodaira (JP); Shigeki Endo, Tokorozawa (JP)

(73) Assignee: Bridgestone Corporation, Tokyo (JP)

( * ) Notice: Subject to any disclaimer, the term of this patent is extended or adjusted under 35 U.S.C. 154(b) by 96 days.

(21) Appl. No.: 10/450,151

(22) PCT Filed: Dec. 21, 2001

(86) PCT No.: PCT/JP01/11270

§ 371 (c)(1),
(2), (4) Date: Jun. 11, 2003

(87) PCT Pub. No.: WO02/053813

PCT Pub. Date: Jul. 11, 2002

(65) Prior Publication Data

US 2004/0050320 A1   Mar. 18, 2004

(30) Foreign Application Priority Data

Dec. 28, 2000 (JP) .......................... 2000-402730
Apr. 10, 2001 (JP) .......................... 2001-111374

(51) Int. Cl.
*C30B 23/02* (2006.01)
*C30B 29/36* (2006.01)

(52) U.S. Cl. .................... 117/109; 117/105; 117/106; 117/108; 117/954

(58) Field of Classification Search ................ 117/105, 117/106, 108, 109, 954
See application file for complete search history.

(56) References Cited

U.S. PATENT DOCUMENTS 5,135,885 A * 8/1992 Furukawa et al. .......... 438/167

(Continued)

FOREIGN PATENT DOCUMENTS

EP   1 164 211 A1   12/2001

(Continued)

OTHER PUBLICATIONS

Jun Takahashi et al., "Sublimation Growth of SiC Singe Crystalline ingots On Faces Perpendicular To The (0001) Basal Plane"; Journal of Crystal Growth 135 (1994); pp. 61-70.

(Continued)

*Primary Examiner*—Robert Kunemund
(74) *Attorney, Agent, or Firm*—Sughrue Mion, PLLC

(57) ABSTRACT

A method of producing a silicon carbide single crystal in which a sublimation raw material 40 is accommodated at the side of vessel body 12 in a graphite crucible 10, placing a seed crystal of a silicon carbide single crystal at the side of cover body 11 of the graphite crucible 10, the sublimation raw material 40 is sublimated by a first induction heating coil 21 placed at the side of sublimation raw material 40, a re-crystallization atmosphere is form by a second induction heating coil 20 placed at the side of cover body 11 so that the sublimation raw material 40 sublimated by the first induction heating coil 21 is re-crystallizable only in the vicinity of the seed crystal of a silicon carbide single crystal, and the sublimation raw material 40 is re-crystallized on the seed crystal of a silicon carbide single crystal, and a silicon carbide single crystal 60 is grown while keeping the whole surface of its growth surface in convex shape through the all growth processes.

A high quality silicon carbide single crystal with large diameter excellent in dielectric breakdown property, heat resistance, radiation resistance and the like, suitable for electronic and optical devices and the like, and showing no contamination of polycrystals and polymorphs, no defect of micropipes and the like can be produced efficiently without cracking and the like.

28 Claims, 8 Drawing Sheets

U.S. PATENT DOCUMENTS

| | | | |
|---|---|---|---|
| 5,279,701 A * | 1/1994 | Shigeta et al. | 117/101 |
| 6,428,621 B1 * | 8/2002 | Vodakov et al. | 117/108 |
| 6,534,026 B1 * | 3/2003 | Vodakov et al. | 423/345 |
| 6,770,137 B1 * | 8/2004 | Hara et al. | 117/201 |

FOREIGN PATENT DOCUMENTS

| | | |
|---|---|---|
| JP | 05-178698 A | 7/1993 |
| JP | 07-157307 A | 6/1995 |
| JP | 10-101495 A | 4/1998 |
| JP | 11-278985 A | 10/1999 |
| WO | WO 98/33961 A1 | 8/1998 |
| WO | WO 00/39372 A1 | 7/2000 |

OTHER PUBLICATIONS

International Search Report, PCT/JP01/11270.

Selder M et al., "Numerical simulation of global heat transfer in reactors for SiC bulk crystal growth by physical vapor transport", Materials Science and Engineering B, Elsevier Sequoia, Lausanne, CH, vol. 61-62, Jul. 30, 1999 pp. 93-97.

Augustine G et al., "Growth and characterization of high-purity SiC single crystals", Journal of Crystal Growth, North-Holland, Amsterdam, NL, vol. 211, No. 1-4, Apr. 2000, pp. 339-342.

* cited by examiner

SILICON CARBIDE SINGLE CRYSTAL AND METHOD AND APPARATUS FOR PRODUCING THE SAME

BACKGROUND OF THE INVENTION

1. Field of the Invention

The present invention relates to a silicon carbide single crystal particularly suitable as an electronic device, optical device or the like, and a method and an apparatus which can produce this silicon carbide single crystal efficiently.

2. Description of the Related Art

Silicon carbide shows a larger band gap and is excellent in dielectric breakdown property, heat resistance, radiation resistance and the like as compared with silicon. Therefore, silicon carbide has been noticed as an electronic device material for small-size high output semiconductors and the like, or as an optical device material owing to its excellent optical property. Of such silicon carbide crystals, silicon carbide single crystals have a merit that, when applied to devices such as a wafer and the like, uniformity of properties in a wafer is particularly excellent as compared with a silicon carbide polycrystals.

Though there are some conventionally suggested methods of producing the above-mentioned silicon carbide single crystal, each of them have a problem that the resulting silicon carbide single crystal shows contamination of a polycrystal or polymorphs and crystal defects in the form of hollow pipe (so-called, micropipe).

Then, as the method of producing a silicon carbide single crystal solving such a problem, for example, a method employing an apparatus for generating a silicon carbide single crystal as shown in FIG. 8 is generally known. This silicon carbide single crystal production apparatus 80 comprises a graphite crucible 10 having a vessel body 12 which can accommodate a sublimation raw material 40 and having a cover body 11 which can be attached to and detached from the vessel body 12 and, when installed on the vessel body 12, can arrange a seed crystal 50 of a silicon carbide single crystal at approximately the center of a surface facing the sublimation raw material 40 accommodated in the vessel body 12; a supporting rod 31 fixing the graphite crucible 10 to the inside of a quartz tube 30; and an induction heating coil 25 placed, being wound in spiral form and at an equal interval, at a part around the outer periphery of the quartz tube 30 and at which part the graphite crucible 10 is situated. In the silicon carbide single crystal production apparatus 80, when the induction heating coil 25 is energized to be heated, the sublimation raw material 40 is heated by this heat. The sublimation raw material 40 sublimates when heated to given temperature. The sublimated raw material 40 does not re-crystallize until cooled to the re-crystallization temperature. Here, an atmosphere at the side of the cover body 11 has temperature lower than that in the side of the sublimation raw material 40 and the sublimation raw material 40 being sublimated can re-crystallize in this atmosphere, therefore, silicon carbide re-crystallizes on the seed crystal 50 of a silicon carbide single crystal, and the crystal of silicon carbide grows.

Under this condition, a silicon carbide single crystal 60 re-crystallizes and grows on the seed crystal 50 of a silicon carbide single crystal, and a silicon carbide polycrystal 70 re-crystallizes and grows on the peripheral part of the seed crystal 50 of a silicon carbide single crystal. Finally, as shown in FIG. 8, a concave portion 71 sinking toward the cover body 11 is shaped in the form of a ring, and the part around this concave portion 71 through at the peripheral side of the cover body 11 are in condition wherein extraneous substances, polycrystals and polymorphs are mixed and present in a large amount. At the cover body 11, the whole surface at the side facing to the inside of the vessel body 12 is covered by crystals of silicon carbide, and on the peripheral part of the cover body 11, a silicon carbide polycrystal 70 grows contacting with the inner peripheral surface of the vessel body 12. Under this condition, when cooled to room temperature, stress based on the thermal expansion difference concentrates on the side of the silicon carbide single crystal 60 from the side of the silicon carbide polycrystal 70, leading to breakage such as cracking and the like on the silicon carbide single crystal 60, as shown in FIG. 9, contamination of polycrystals and polymorphs or defects such as micropipes and the like, in some cases. At recentness wherein production of a silicon carbide single crystal of large diameter is required, this phenomenon is an important problem which should be overcome.

That is, a high quality silicon carbide single crystal showing no such breakages as cracking and the like, no contamination of polycrystals and polymorphs and having no defect such as micropipes, and a method and an apparatus which can efficiently and easily produce such a high quality silicon carbide single crystal with large diameter, are not provided yet, and these are needed to be provided, under the present situation.

SUMMARY OF THE INVENTION

The subject of the present invention is to solve the above-mentioned conventional various problems and to attain the following object, responding to the above-mentioned requirement.

An object of the present invention is to provide a high quality silicon carbide single crystal excellent in dielectric breakdown property, heat resistance, radiation resistance and the like, particularly suitable for electronic devices such as semiconductor wafers and the like and optical devices such as emitting diodes and the like, and having no contamination of polycrystals and polymorphs and no defects such as micropipes and the like, and a method and an apparatus which can efficiently and easily produce the above-mentioned high quality silicon carbide single crystal with large diameter, under condition including no breakages such as cracking and the like.

Means for attaining the above-mentioned object are as described below.

<1> A method of producing a silicon carbide single crystal in which a sublimation raw material being sublimated is re-crystallized to grow a silicon carbide single crystal, comprising growing the silicon carbide single crystal while maintaining the whole growing surface in a convex shape throughout all growth processes.

<2> The method of producing a silicon carbide single crystal according to <1>, wherein a crystal of silicon carbide containing a silicon carbide single crystal is grown approximately in a protruded shape.

<3> The method of producing a silicon carbide single crystal according to <1> or <2>, comprising growing the crystal of silicon carbide containing a silicon carbide single crystal while maintaining the approximate protruded shape and, wherein the diameter of the crystal of silicon carbide decreases gradually toward the sublimation raw material throughout all the growth processes.

<4> The method of producing a silicon carbide single crystal according to any of <1> to <3>, further comprising
accommodating the sublimation raw material in a reaction vessel,
placing a seed crystal of a silicon carbide single crystal at an end approximately facing the sublimation raw material in the reaction vessel, and
conducting the growth of the crystal of silicon carbide containing a silicon carbide single crystal only in a region excluding a part adjacent to a peripheral side surface part in the reaction vessel.

<5> A method of producing a silicon carbide single crystal in which a sublimation raw material being sublimated is re-crystallized to grow a silicon carbide single crystal, comprising
accommodating the sublimation raw material in a reaction vessel,
placing the seed crystal of a silicon carbide single crystal at the end approximately facing the sublimation raw material in the reaction vessel, and
growing the crystal of silicon carbide containing a silicon carbide single crystal only in a region excluding the part adjacent to the peripheral side surface part in the reaction vessel at the end.

<6> The method of producing a silicon carbide single crystal according to any of <2> to <5>,
wherein the crystal of silicon carbide containing a silicon carbide single crystal is composed only of a silicon carbide single crystal.

<7> The method of producing a silicon carbide single crystal according to any of <1> to <6>, further comprising
accommodating a sublimation raw material at one end side in a reaction vessel, and placing a seed crystal of a silicon carbide single crystal at another end side in the reaction vessel;
forming a sublimation atmosphere by a first heating means placed at the one end side so as to enable sublimation of the sublimation raw material;
forming a re-crystallization atmosphere by a second heating means placed at another end side so that the sublimation raw material being sublimate by the first heating means is re-crystallizable only in the vicinity of the seed crystal of a silicon carbide single crystal, and the sublimation raw material is re-crystallized on the seed crystal of a silicon carbide single crystal.

<8> The method of producing a silicon carbide single crystal according to <7>,
wherein the temperature of the re-crystallization atmosphere is lower than the temperature of the sublimation atmosphere by 30 to 300° C., in the reaction vessel.

<9> The method of producing a silicon carbide single crystal according to <7> or <8>,
wherein the first heating means and the second heating means are an induction-heatable coil.

<10> The method of producing a silicon carbide single crystal according to <9>,
wherein the current value of the induction heating current in the first heating means is larger than the current value of the induction heating current in the second heating means.

<11> The method of producing a silicon carbide single crystal according to <9> or <10>,
wherein the current value of the induction heating current in the second heating means is decreased continuously or gradually with the increase of the diameter of a growing silicon carbide single crystal.

<12> The method of producing a silicon carbide single crystal according to any of <7> to <11>,
wherein if the temperature at one end side accommodating a sublimation raw material is represented by $T_1$ and the temperature at another end side at which a seed crystal of a silicon carbide single crystal is placed is represented by $T_2$, in the reaction vessel, and the temperature of the part adjacent to the inner peripheral side surface part of the reaction vessel at said another end side is represented by $T_3$, then, $T_3-T_2$ and $T_1-T_2$ increase continuously or gradually.

<13> The method of producing a silicon carbide single crystal according to any of <9> to <12>,
wherein an interference preventing means capable of flowing the induction current and preventing interference between the first heating means and the second heating means by flowing the induction current is placed between the first heating means and the second heating means.

<14> The method of producing a silicon carbide single crystal according to <13>, wherein the interference preventing means is a coil through which cooling water can flow.

<15> The method of producing a silicon carbide single crystal according to any of <7> to <14>, wherein the one end is a lower end and another end is an upper end.

<16> The method of producing a silicon carbide single crystal according to any of <7> to <15>, wherein the reaction vessel is a crucible placed in a quartz tube.

<17> The method of producing a silicon carbide single crystal according to any of <7> to <16>,
wherein a first region in which a silicon carbide single crystal is grown and a second region situated at the outer periphery of the first region and adjacent to the inner peripheral side surface part of the reaction vessel, at another end, are formed from different members, and one end of the member forming the first region in which a silicon carbide single crystal is grown is exposed to the inside of the reaction vessel and another end thereof is exposed to the outside of the reaction vessel.

<18> The method of producing a silicon carbide single crystal according to any of <5> to <17>, wherein the surface of the part adjacent to the peripheral side surface part in the reaction vessel at another end is made of glassy carbon.

<19> The method of producing a silicon carbide single crystal according to any of <1> to <18>, wherein the sublimation raw material is a silicon carbide powder obtained by
using as a silicon source at least one compound selected from high purity alkoxysilanes and alkoxysilane polymers, as a carbon source a high purity organic compound generating carbon by heating;
uniformly mixing the silicon source and the carbon source to obtain a mixture; and
calcinating the resulted mixture by heating under a non-oxidizing atmosphere.

<20> The method of producing a silicon carbide single crystal according to any of <1> to <18>, wherein the sublimation raw material is a silicon carbide powder obtained by
using as a silicon source a high purity alkoxysilane, as a carbon source a high purity organic compound generating carbon by heating;
uniformly mixing the silicon source and the carbon source to obtain a mixture; and calcinating the resulted mixture by heating under a non-oxidizing atmosphere.

<21> The method of producing a silicon carbide single crystal according to any of <1> to <18>, wherein the sublimation raw material is a silicon carbide powder obtained by using as a silicon source at least one of a high purity alkoxysilane and a polymer of a high purity alkoxysilane, as a carbon source a high purity organic compound generating carbon by heating;

uniformly mixing the silicon source and the carbon source to obtain a mixture; and calcinating the resulted mixture by heating under a non-oxidizing atmosphere.

<22> The method of producing a silicon carbide single crystal according to any of <1> to <18>, wherein the sublimation raw material is a silicon carbide powder obtained by using as a silicon source at least one compound selected from the group consisting of high purity methoxysilane, high purity ethoxysilane, high purity propoxysilane and high purity butoxysilane, as a carbon source a high purity organic compound generating carbon by heating;

uniformly mixing the silicon source and the carbon source to obtain a mixture; and calcinating the resulted mixture by heating under a non-oxidizing atmosphere.

<23> The method of producing a silicon carbide single crystal according to any of <1> to <18>, wherein the sublimation raw material is a silicon carbide powder obtained by using as a silicon source at least one compound selected from the group consisting of high purity methoxysilane, high purity ethoxysilane, high purity propoxysilane and high purity butoxysilane, and a polymer of them having a polymerization degree of 2 to 15, as a carbon source a high purity organic compound generating carbon by heating;

uniformly mixing the silicon source and the carbon source to obtain a mixture, and calcinating the resulted mixture by heating under a non-oxidizing atmosphere.

<24> The method of producing a silicon carbide single crystal according to any of <1> to <18>, wherein the sublimation raw material is a silicon carbide powder obtained by using as a silicon source at least one of compound selected from the group consisting of high purity monoalkoxysilanes, high purity dialkoxysilanes, high purity trialkoxysilanes and high purity tetraalkoxysilanes, and a polymer of them having a polymerization degree of 2 to 15, as a carbon source a high purity organic compound generating carbon by heating;

uniformly mixing the silicon source and the carbon source to obtain a mixture; and calcinating the resulted mixture by heating under a non-oxidizing atmosphere.

<25> The method of producing a silicon carbide single crystal according to any of <19> to <24>, wherein the silicon source is a tetraalkoxysilane polymer and the carbon source is a phenol resin.

<26> The method of producing a silicon carbide single crystal according to any of <19> to <25>, wherein each content of impurity elements in the silicon carbide powder is 0.5 ppm or less.

<27> A silicon carbide single crystal produced by the method of producing a silicon carbide single crystal according to any of <1> to <26>.

<28> The silicon carbide single crystal according to <27>, wherein the crystal defect in the form of hollow pipe of which image is optically detected is 100/cm$^2$ or less.

<29> The silicon carbide single crystal according to <27> or <28>, wherein the total content of impurity elements is 10 ppm or less.

<30> An apparatus for generating a silicon carbide single crystal in which a sublimation raw material being sublimated is re-crystallized to grow a silicon carbide single crystal, comprising a crucible provided with a vessel body to accommodate a sublimation raw material and a cover body attachable to and detachable from the vessel body and, when the cover body is installed on the vessel body, a seed crystal of a silicon carbide single crystal can be arranged at a surface facing the inside of the vessel body;

a first induction heating coil placed in the state wound around the outer periphery of a part or the crucible when the sublimation raw material is accommodated, and forming a sublimation atmosphere so as to enable sublimation of the sublimation raw material; and a second induction heating coil placed in the state wound around the outer periphery of a part of a crucible where the seed crystal is placed, forming a re-crystallization atmosphere so that the sublimation raw material being sublimate by the first induction heating coil is re-crystallizable only in the vicinity of the seed crystal of a silicon carbide single crystal, and re-crystallizing the sublimation raw material on the seed crystal of a silicon carbide single crystal.

The above-described method of producing a silicon carbide single crystal described in <1> is a method in which a sublimation raw material being sublimated is re-crystallized to grow a silicon carbide single crystal, wherein the above-mentioned silicon carbide single crystal is grown while maintaining the whole growing surface in a convex shape throughout the all growth processes. In this method of producing a silicon carbide single crystal, the above-mentioned concave portion sunk toward the reverse direction to the growth direction is not shaped in the form of ring at the whole surface of the growth surface of the growing silicon carbide single crystal. Therefore, a high quality silicon carbide single crystal is produced having no conventional various problems described above, namely, showing no breakages such as cracking and the like and having no contamination of polycrystals and polymorphs and no crystal defects present such as micropipes and the like.

In the above-mentioned methods of generating a silicon carbide single crystal described in <2> and <3>, a crystal of silicon carbide containing a silicon carbide single crystal is grown approximately in shape in <1>, consequently, the above-mentioned concave portion sunk toward the reverse direction to its growth direction is not present at all, in the growing silicon carbide single crystal. Therefore, a high quality silicon carbide single crystal is produced having no conventional various problems described above, namely, showing no breakages such as cracking and the like and having no contamination of polycrystals and polymorphs and no crystal defects present such as micropipes and the like.

In the above-mentioned method of producing a silicon carbide single crystal described in <4>, the above-mentioned sublimation raw material is accommodated in a reaction vessel, placing a seed crystal of a silicon carbide single crystal at the end approximately facing the sublimation rawmaterial in the reaction vessel, and growth of the above-mentioned crystal of silicon carbide containing a silicon carbide single crystal is conducted only in a region excluding the part adjacent to the peripheral side surface part in the reaction vessel, at the above-mentioned end, in any of <1> to <3>. Therefore, the above-mentioned concave portion sunk toward the reverse direction to the growth direction of the silicon carbide single crystal is not shaped in the form of ring, in the growing silicon carbide single crystal, further, the silicon carbide single crystal does not grow contacting with the peripheral surface part in the reaction vessel. Therefore, stress based on the thermal expansion difference does not concentrate on the silicon carbide single crystal side from the silicon carbide polycrystal side when a grown silicon carbide single crystal is cooled to room temperature, and defects such as cracking and the like do not occur on the resulting silicon carbide single crystal. As a result, a high quality silicon carbide single crystal is efficiently and securely produced having no conventional various problems described above, namely, showing no breakages such as cracking and the like and having no contamination of polycrystals and polymorphs and no crystal defects present such as micropipes and the like.

The method of producing a silicon carbide single crystal described in <5> is a method of producing a silicon carbide single crystal in which a sublimation raw material being sublimated is re-crystallized to grow a silicon carbide single crystal, wherein the above-mentioned sublimation raw material is accommodated in a reaction vessel, the above-mentioned seed crystal of a silicon carbide single crystal is placed at the end approximately facing the sublimation raw material in the reaction vessel, and the above-mentioned crystal of silicon carbide containing a silicon carbide single crystal is grown only in a region excluding the part adjacent to the peripheral surface part in the reaction vessel, at the above-mentioned end. Therefore, the above-mentioned silicon carbide single crystal does not grow contacting with the peripheral surface part in the reaction vessel, at the above-mentioned end. Stress based on thermal expansion difference on the silicon carbide single crystal side from the silicon carbide polycrystal side when a grown silicon carbide single crystal is cooled to room temperature, and defects such as cracking and the like do not occur on the resulting silicon carbide single crystal. As a result, a high quality silicon carbide single crystal is produced having no conventional various problems described above, namely, showing no breakages such as cracking and the like and having no crystal defects present such as contamination of polycrystals and polymorphs and micropipes and the like.

In the method of producing a silicon carbide single crystal described in <6>, the above-mentioned crystal of silicon carbide containing a silicon carbide single crystal is composed only of a silicon carbide single crystal, in any of <2> to <5>. Therefore, a silicon carbide single crystal having a larger diameter is obtained, and it is not necessary to separate the silicon carbide single crystal from a silicon carbide polycrystal and the like.

In the method of producing a silicon carbide single crystal described in <7>, the above-mentioned sublimation raw material is accommodated at one end side in the above-mentioned reaction vessel, and the above-mentioned seed crystal of a silicon carbide single crystal is placed at another end side in the reaction vessel, a sublimation atmosphere is formed by a first heating means placed at the above-mentioned one end side so as to enable sublimation of the sublimation raw material, a re-crystallization atmosphere is formed by a second heating means placed at the above-mentioned another end side so that the above-mentioned sublimation raw material being sublimated by the above-mentioned first heating means is re-crystallizable only in the vicinity of the above-mentioned seed crystal of a silicon carbide single crystal, and the sublimation raw material is re-crystallized on the above-mentioned seed crystal of a silicon carbide single crystal, in any of <1> to <6>.

In this method of producing a silicon carbide single crystal, heating for formation of a sublimation atmosphere so as to enable sublimation of the above-mentioned sublimation raw material is conducted by the above-mentioned first heating means, formation of a re-crystallization atmosphere so as to enable re-crystallization only on the above-mentioned seed crystal of a silicon carbide single crystal is conducted by the above-mentioned second heating means, as a result, re-crystallization can be conducted selectively only on the above-mentioned seed crystal of a silicon carbide single crystal and the part in the vicinity of this, and the above-mentioned silicon carbide polycrystal does not grow contacting with the peripheral side surface part in the reaction vessel, at the above-mentioned end. And, stress based on thermal expansion difference on the silicon carbide single crystal side from the silicon carbide polycrystal side when a grown silicon carbide single crystal is cooled to room temperature, and defects such as cracking and the like do not occur on the resulting silicon carbide single crystal. As a result, a high quality silicon carbide single crystal is produced having no conventional various problems described above, namely, showing no breakages such as cracking and the like and having no crystal defects present such as contamination of polycrystals and polymorphs and micropipes and the like.

In the method of producing a silicon carbide single crystal described in <8>, the temperature of the re-crystallization atmosphere is lower than the temperature of the sublimation atmosphere by 30 to 300° C., in the above-mentioned reaction vessel, in <7>.

In the method of producing a silicon carbide single crystal described in <9>, the above-mentioned first heating means and the above-mentioned second heating means are an induction-heatable coil, in <7> or <8>. Therefore, control of the temperature of the above-mentioned first heating means for forming the above-mentioned sublimation atmosphere and control of the temperature of the above-mentioned second heating means for forming the above-mentioned re-crystallization atmosphere can be conducted easily and securely, by induction heating by this coil.

In the method of producing a silicon carbide single crystal described in <10>, the current value of the induction heating current in the first heating means is larger than the current value of the induction heating current in the second heating means, in any of <7> to <9>. Therefore, the temperature of the re-crystallization atmosphere in the vicinity of on the above-mentioned seed crystal is maintained lower than the temperature of the above-mentioned sublimation atmosphere, and re-crystallization is conducted easily.

In the method of producing a silicon carbide single crystal described in <11>, the current value of the induction heating current in the above-mentioned second heating means is decreased continuously or gradually with the increase of the diameter of a growing silicon carbide single crystal, in any of <7> to <10>. By this constitution, the heating quantity by the above-mentioned second heating means is controlled to be smaller with the growth of the above-mentioned silicon carbide single crystal, therefore, re-crystallization is conducted only in the vicinity of the above-mentioned silicon carbide single crystal keeping on growing, and a polycrystal is not formed around the silicon carbide single crystal.

In the method of producing a silicon carbide single crystal described in <12>, if the temperature at one end side accommodating a sublimation raw material is represented by $T_1$ and the temperature at another end side at which a seed crystal of a silicon carbide single crystal is arranged is represented by $T_2$, in the reaction vessel, and the temperature of the part adjacent to the inner peripheral side surface part of the reaction vessel, at another end side, is represented by $T_3$, then, $T_3-T_2$ and $T_1-T_2$ increase continuously or gradually, in any of <7> to <11>. When $T_1-T_2$ increases continuously or gradually, even if a silicon carbide single crystal keeps on growing toward the above-mentioned one end side, with the lapse of time, the crystal growth peak side of the silicon carbide single crystal is always maintained at the condition susceptible to re-crystallization. On the other hand, when $T_3-T_2$ increases continuously or gradually, even if a silicon carbide single crystal keeps on growing toward the peripheral direction at the above-mentioned another end side, with the lapse of time, the crystal growth peripheral end side of the silicon carbide single crystal is always maintained at the condition susceptible to re-crystallization. As a result, production of a silicon carbide single crystal is effectively suppressed, and the silicon carbide single crystal keeps on growing toward a direction along which its thickness increases and its diameter enlarges, and finally, a silicon carbide single crystal of a larger diameter is obtained under condition without contamination of a silicon carbide polycrystal and the like.

In the method of producing a silicon carbide single crystal described in <13>, an interference preventing means capable of flowing the induction current and preventing interference between the first heating means and the second heating means by flowing the induction current is placed between the first heating means and the second heating means, in any of <9> to <12>. Owing to this constitution, when induction heating by the above-mentioned first heating means and induction heating by the above-mentioned second heating means are conducted simultaneously, induction current flows through the interference preventing means and the interference preventing means minimizes and prevents interference between them.

In the method of producing a silicon carbide single crystal described in <14>, the interference preventing means is a coolable coil, in <13>. Since this coil is cooled even if induction current flows in the coil to heat the coil, this coil does not heat the above-mentioned reaction vessel. Namely, control of the temperature of the above-mentioned reaction vessel is easy.

In the method of producing a silicon carbide single crystal described in <15>, the above-mentioned one end is a lower end and the above-mentioned another end is an upper end, in any of <7> to <14>. Therefore, the above-mentioned sublimation raw material is accommodated in the lower portion of the above-mentioned reaction vessel, and sublimation of the sublimation raw material is conducted smoothly, and the above-mentioned silicon carbide single crystal grows toward lower direction, namely, grows under condition without an excess load toward the gravity direction.

In the method of producing a silicon carbide single crystal described in <16>, the reaction vessel is a crucible placed in a quartz tube, in any of <7> to <15>. Namely, since sublimation and re-crystallization of the above-mentioned sublimation raw material, and growth of the above-mentioned silicon carbide single crystal are conducted in the sealed system in the quartz tube, the control of them is easy.

In the method of producing a silicon carbide single crystal described in <17>, a region in which the silicon carbide single crystal is grown and a region situated at the outer periphery of the above-mentioned region and adjacent to the inner peripheral side surface part of the above-mentioned reaction vessel, are formed from different members, and one end of the member forming the region in which the silicon carbide single crystal is grown is exposed to the inside of the reaction vessel and another end thereof is exposed to the outside of the reaction vessel, in any of <7> to <16>. Since the region in which the silicon carbide single crystal is grown (inside region) and the region situated at the outer periphery of the above-mentioned region and adjacent to the inner peripheral side surface part of the above-mentioned reaction vessel (outside region) are formed from different members, when heating is conducted by the above-mentioned second heating means, the above-mentioned outside region situated at the second heating means side is heated easily, however, the inside region is not heated easily by the difference of contact resistance with the outside region. Therefore, even if heating is conducted by the above-mentioned second heating means, a difference in temperature occurs between the above-mentioned outside region and the above-mentioned inside region, and since the above-mentioned inside region is not heated easily than the above-mentioned outside region, temperature is maintained low and the above-mentioned re-crystallization of silicon carbide is conducted easily. Further, since the opposite side to the inside of the above-mentioned reaction vessel in the member forming the above-mentioned inside region is exposed to the outside of the reaction vessel and consequently heat is easily discharged out of the reaction vessel, when heating is conducted by the above-mentioned second heating means, the above-mentioned inside region is not heated easily than the above-mentioned outside region, a difference in temperature occurs between the above-mentioned outside region and the above-mentioned inside region, the temperature of the above-mentioned inside region is maintained lower than the temperature of the above-mentioned outside region, consequently, the above-mentioned re-crystallization of silicon carbide is conducted easily. As a result, a silicon carbide single crystal does not grow easily in the above-mentioned outside region, and a silicon carbide single crystal re-crystallizes and grows selectively only in the inside region.

In the method of producing a silicon carbide single crystal described in <18>, the surface of the part adjacent to the inner peripheral side surface part of the reaction vessel is made of glassy carbon, in any of <5> to <17>. Therefore, the part adjacent to the inner peripheral side surface part of the reaction vessel does not easily cause re-crystallization than regions other than the above-mentioned adjacent part. As a result, a crystal of silicon carbide does not grow at the above-mentioned adjacent part, at the above-mentioned another end, and a silicon carbide single crystal re-crystallizes and grows selectively only in regions other than the above-mentioned adjacent part.

In the methods of generating a silicon carbide single crystal described in <19> to <24>, the above-mentioned sublimation raw material is a silicon carbide powder obtained by using as a silicon source at least one compound selected from high purity alkoxysilanes and alkoxysilane polymers, using as a carbon source a high purity organic compound generating carbon by heating, uniformly mixing the silicon source and the carbon source to obtain a mixture, and calcinating the resulted mixture by heating under a non-oxidizing atmosphere, in any of <1> to <18>. Since the sublimation raw material is a high purity silicon carbide powder, contamination of polycrystals and polymorphs into a silicon carbide single crystal does not occur when growing a silicon carbide single crystal, and a silicon carbide single crystal grows smoothly and the resulted silicon carbide single crystal contains no defects such as micropipes and the like.

In the method of producing a silicon carbide single crystal described in <25>, the above-mentioned silicon source is a tetraalkoxysilane polymer and the above-mentioned carbon source is a phenol resin, in any of <19> to <24>. Therefore, the above-mentioned sublimation raw material is obtained easily at low cost.

In the method of producing a silicon carbide single crystal described in <26>, each content of impurity elements in the above-mentioned silicon carbide powder is 0.5 ppm or less, in any of <19> to <25>. Therefore, the above-mentioned sublimation raw material has extremely high purity, and contamination of polycrystals and polymorphs into the above-mentioned silicon carbide single crystal and generation of crystal defects are effectively suppressed.

The silicon carbide single crystal described in <27> is produced by the method of producing a silicon carbide single crystal described in any of <1> to <26>. Therefore, the resulting silicon carbide single crystal shows no breakages such as cracking and the like and has no crystal defects such as contamination of polycrystals and polymorphs and micropipes and the like present, namely, has extremely high quality and excellent in dielectric breakdown property, heat resistance, radiation resistance and the like and suitable particularly for electronic devices such as semiconductor wafers and the like, optical devices such as light emitting diodes and the like.

In the silicon carbide single crystal described in <28>, the crystal defects in the form of hollow pipe of which image is 100/cm$^2$ or less, in <27>. Therefore, the silicon carbide single crystal has extremely high quality, particularly excellent in dielectric breakdown property, heat resistance, radiation resistance and the like, and suitable particularly for electronic devices such as semiconductor wafers and the like, optical devices such as light emitting diodes and the like.

In the silicon carbide single crystal described in <29>, the total content of the above-mentioned impurity elements is 10 ppm or less, in <27> or <28>. Therefore, the silicon carbide single crystal has very high quality.

An apparatus for generating a silicon carbide single crystal described in <30> is an apparatus for generating a silicon carbide single crystal wherein a sublimation raw material being sublimated is re-crystallized to grow a silicon carbide single crystal.

This silicon carbide single crystal production apparatus comprises at least a crucible having a vessel body and a cover body, a first induction heating coil and a second induction heating coil.

In the above-mentioned crucible, the above-mentioned-vessel body accommodates the above-mentioned sublimation raw-material. The above-mentioned cover body can be attached to and detached from the above-mentioned vessel body. When the cover body is installed to the above-mentioned vessel body, placing a seed crystal of a silicon carbide single crystal on a surface facing the inside of the vessel body. The above-mentioned first induction heating coil is placed, being wound, at the outer periphery of the part accommodating the above-mentioned sublimation raw material, in the above-mentioned crucible, and this forms a sublimation atmosphere so as to enable sublimation of the sublimation raw material, to sublimate the sublimation raw material. The above-mentioned second induction heating coil is placed, being wound, at the outer periphery of the part at which the above-mentioned seed crystal is placed, in the above-mentioned crucible, and this forms a re-crystallization atmosphere so that the above-mentioned sublimation raw material being sublimate by the above-mentioned first induction heating coil is re-crystallizable only in the vicinity of the above-mentioned seed crystal of a silicon carbide single crystal, and re-crystallizes the sublimation raw material on the above-mentioned seed crystal of a silicon carbide single crystal. Owing to this constitution, a silicon carbide single crystal is grown while maintaining the whole growing surface in a convex shape throughout the all growth processes, a concave portion sunk toward the reverse direction to the growth direction is not shaped in the form of ring, further, a silicon carbide single crystal does not grow contacting with the peripheral side surface part in the vessel body. Consequently, stress based on thermal expansion difference on the silicon carbide single crystal side from the silicon carbide polycrystal side when a grown silicon carbide single crystal is cooled to room temperature, and defects such as cracking and the like do not occur on the resulting silicon carbide single crystal. As a result, a high quality silicon carbide single crystal is efficiently and securely produced showing no breakages such as cracking and the like and having no crystal defects present such as contamination of polycrystals and polymorphis and micropipes and the like.

This application claims benefit of priority based on Japanese Patent Application previously filed by this applicant, namely, No. 2000-402730 (filing date Dec. 28, 2000) and No. 2001-111374 (filing date Apr. 10, 2001), the specifications of which are incorporated by reference herein.

BRIEF EXPLANATION OF THE DRAWINGS

Other objects, features, and advantages of the invention will become apparent from the following description taken together with the drawings, in which.

EXPLANATION OF MARKS

Figure 1:
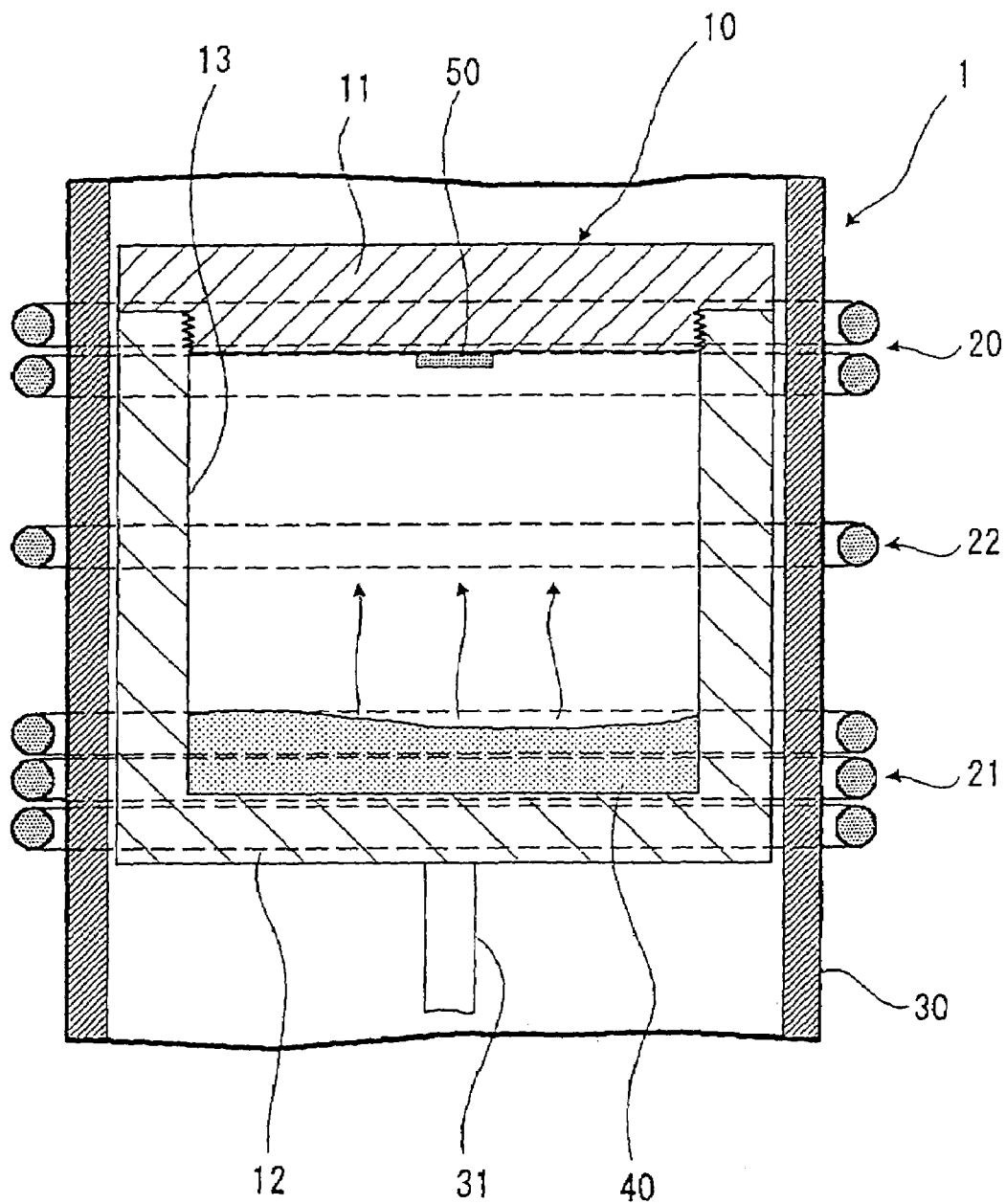
FIG. 1 is a schematic view for illustrating the initial condition in the method of producing a silicon carbide single crystal of the present invention.

1: Apparatus for generating a silicon carbide single crystal
10: Graphite crucible
11: Cover body
12: Vessel body
13: Peripheral side surface part
15: Inside region forming part
20: Second induction heating coil
21: First induction heating coil
22: Interference preventing coil
25: Induction heating coil
30: Quartz tube
31: Supporting rod
40: Sublimation raw material
50: Seed crystal of silicon carbide single crystal
60: Silicon carbide single crystal
70: Silicon carbide polycrystal
71: Concave portion
80: Conventional apparatus for generating a silicon carbide single crystal

DETAILED DESCRIPTION OF THE INVENTION (Method of Generating Silicon Carbide Single Crystal)

The method of producing a silicon carbide single crystal of the present invention will be described below.

The method of producing a silicon carbide single crystal of the present invention is a method of producing a silicon carbide single crystal in which a sublimation raw material being sublimated is re-crystallized on a seed crystal of a silicon carbide single crystal to grow a silicon carbide single crystal.

In the method of producing a silicon carbide single crystal of the present invention, the following first to third embodiments are listed, and among them, the third embodiment is a preferable embodiment having a content combining the first embodiment and the second embodiment.

In the first embodiment, the above-mentioned silicon carbide single crystal is grown while maintaining the whole growing surface in a convex shape throughout the all growth processes.

In the second embodiment, the above-mentioned sublimation raw material is accommodated in a reaction vessel, placing a seed crystal of a silicon carbide single crystal at the end approximately facing the sublimation raw material in the reaction vessel, and the above-mentioned silicon carbide single crystal is grown only in regions excluding the part adjacent to the peripheral side surface part in the reaction vessel, at the above-mentioned end.

In the third embodiment, the above-mentioned sublimation raw material is accommodated in a reaction vessel, placing a seed crystal of a silicon carbide single crystal at the end approximately facing the sublimation raw material in the reaction vessel, and the above-mentioned silicon carbide single crystal is grown while maintaining the whole growing surface in a convex shape throughout the all growth processes and only in a regions (inside part) excluding the part (outside pate) adjacent to the peripheral side surface part in the reaction vessel, at the above-mentioned end.

-Reaction Vessel-

The reaction vessel is not particularly restricted and can be appropriately selected depending on its object, and it is preferable that it can contain the above-mentioned sublimation raw material inside and it has an end on which the above-mentioned seed crystal of a silicon carbide single crystal can be placed, at a position approximately facing the sublimation raw material.

The form of the above-mentioned end is not particularly restricted and preferably in the form of approximate flat, for example.

The site accommodating the above-mentioned sublimation raw material is not particularly restricted, and preferably an end approximately facing one end at which the above-mentioned seed crystal of a silicon carbide single crystal can be placed. In this case, the inside of the above-mentioned reaction vessel is in the form of cylinder, and the axis of this cylindrical form may be linear or curved, and the form of a section vertical to the axis direction of this cylindrical form may be circle or polygon. Suitably listed as the preferable example of the circular form are those having a linear axis and having a section vertical to the axis direction, in the form of circle.

When two ends are present in the above-mentioned reaction vessel, the above-mentioned sublimation raw material is accommodated in one end side and the above-mentioned seed crystal of a silicon carbide single crystal is placed in another end side. Hereinafter, the above-mentioned one end may be referred to as "sublimation raw material accommodating part", and the above-mentioned another end may be referred to as "seed crystal placing part".

The form of the above-mentioned one end (sublimation raw material accommodating part) is not particularly restricted, and may be in the flat form, or a structure for promoting soaking (for example, convex portion and the like) may be appropriately provided.

In the above-mentioned reaction vessel, it is preferable that the above-mentioned another end (seed crystal placing part) is designed so as to enable attachment and detachment. In this case, it is advantageous in that a grown silicon carbide single crystal can be easily separated from the reaction vessel only by removing another end (seed crystal placing part).

Suitably listed such a reaction vessel is, for example, a reaction vessel comprising a vessel body which can accommodate a sublimation raw material and a cover body which can be attached to and detached from the vessel body and, when installed on the vessel body, can carry a seed crystal of a silicon carbide single crystal placed at approximately the center of a surface facing the above-mentioned sublimation raw material accommodated in the reaction vessel, and other vessels.

The positional relation between the above-mentioned one end (sublimation raw material accommodating part) and the above-mentioned another end (seed crystal placing part) is not particularly restricted and can be appropriately selected depending on its object, and it is preferable that the above-mentioned one end (sublimation raw material accommodating part) is a lower end and the above-mentioned another end (seed crystal placing part) is an upper end, namely, that the above-mentioned one end (sublimation raw material accommodating part) and the above-mentioned another end (seed crystal placing part) are situated along the gravity direction. This case is preferable in that sublimation of the above-mentioned sublimation raw material is conducted smoothly, and growth of the above-mentioned silicon carbide single crystal is conducted toward lower direction, namely, conducted under condition without an excess load toward the gravity direction.

At the above-mentioned one end (sublimation raw material accommodating part), a member formed of a material excellent in heat conductivity, for example, may be placed for the purpose of conducting sublimation of the above-mentioned sublimation raw material efficiently.

Suitably listed as this member are, for example, members in the form of reverse cone or reverse truncated cone of which outer periphery can closely contact with the peripheral side surface part in the above-mentioned reaction vessel and of which inner diameter gradually increases when approaching the above-mentioned another end (seed crystal placing part), and other members.

On the portion exposed to the outside of the above-mentioned reaction vessel, threading, concave portion for measuring temperature, and the like may be provided, depending on the object, and the concave portion for measuring temperature is preferably provided at at least one of the above-mentioned one end side and the above-mentioned another end side.

The material of the above-mentioned reaction vessel is not particularly restricted and can be appropriately selected depending on the object, and it is preferable that the reaction vessel is formed of a material excellent in durability, heat resistance, heat conductivity and the like, and particularly preferable is graphite in that contamination of polycrystals and polymorphs due to generation of impurities is little and control of sublimation and re-crystallization of the above-mentioned sublimation raw material is easy, and the like, in addition to the above-mentioned properties.

The above-mentioned reaction vessel may be formed from a single member, or two or more members, and members can be appropriately selected depending on the object. When formed from two or more members, it is preferable that the above-mentioned another end (seed crystal placing part) is formed from two or more members, and it is more preferable that the center part and its peripheral part of the above-mentioned another end (seed crystal placing part) are formed from different members since the temperature difference or temperature gradient can be formed. Specifically, it is particularly preferable in the above-mentioned reaction vessel that a region in which a silicon carbide single crystal is grown (inside region) as the center part and a region situated at the outer periphery of the above-mentioned inside region and adjacent to the inner peripheral side surface part of the reaction vessel (outside region) as the peripheral part are formed from different members, and one end of a member forming the inside region is exposed to the inside of the reaction vessel and another end thereof is exposed to the outside of the reaction vessel.

In this case, when the above-mentioned another end (seed crystal placing part) is heated from its outside, the above-mentioned outside region is heated easily, however, the above-mentioned inside region is not easily heated due to contact resistance with the outside region. Therefore, a difference in temperature occurs between the above-mentioned outside region and the above-mentioned inside region, the temperature of the inside region is maintained slightly lower than the temperature of the outside region, and silicon carbide can be re-crystallized more easily in the inside region than in the outside region. Further, since the above-mentioned another end of a member forming the above-mentioned inside region is exposed to the outside of the above-mentioned reaction vessel, the inside region easily discharges heat to the outside of the above-mentioned reaction vessel, consequently, silicon carbide is re-crystallized more easily in the inside region than in the outside region.

Here, the embodiment in which the above-mentioned another end of a member forming the above-mentioned inside region is exposed to the outside of the above-mentioned reaction vessel is not particularly restricted, and shapes having the inside region as the bottom surface and having a diameter varying (increasing or decreasing) continuously or discontinuously toward the outside of the above-mentioned reaction vessel, and the like are listed.

Specifically listed as such a form are pillar forms having the inside region as the bottom surface (cylinder, prism and the like are listed, and cylinder is preferable), truncated pyramidal forms (truncated cone, truncated pyramid, reverse truncated cone, reverse truncated pyramid and the like are listed, and reverse truncated cone is preferable), and the like.

It is preferable in the above-mentioned reaction vessel that the surface of a region (outside region) situated at the outer periphery of the above-mentioned region (inside region) in which a silicon carbide single crystal is grown and adjacent to the inner peripheral side surface part of the reaction vessel, at the above-mentioned another end (seed crystal placing part), is made of glassy carbon or amorphous carbon. In this case, the above-mentioned outside region is preferable in that re-crystallization does not occur easily as compared with the above-mentioned inside region.

It is preferable that the above-mentioned reaction vessel is surrounded by a heat insulating material and the like. In this case, it is preferable that the above-mentioned heat insulating material and the like are not provided at approximately the center of the above-mentioned one end (sublimation raw material accommodating part) and the above-mentioned another end (seed crystal placing part) in the above-mentioned reaction vessel, for the purpose of forming a temperature measuring window. When the above-mentioned temperature measuring window is provided at approximately the center of the above-mentioned one end (sublimation raw material accommodating part), it is preferable that a graphite cover member and the like are further provided for preventing falling the above-mentioned heat insulating material powder and the like.

It is preferable that the above-mentioned reaction vessel is placed in a quartz tube. This is preferable in that loss of heat energy for sublimation and re-crystallization of the above-mentioned sublimation raw material is small.

A high purity quartz tube is available, and use of the high purity product is advantageous in that contamination of metal impurities is small.

-Sublimation Raw Material-

Regarding the above-mentioned sublimation raw material, the polymorphs of a crystal, use amount, purity, its production method and the like are not particularly restricted as long as the material is made of silicon carbide, and can be appropriately selected depending on the object.

As the polymorphs of a crystal of the above-mentioned sublimation raw material, for example, 4H, 6H, 15R, 3C and the like listed, and among them, 6H and the like are suitably listed. These are preferably used alone, however, two or more of them may be used in combination.

The use amount of the above-mentioned sublimation raw material can be appropriately selected depending on the size of a silicon carbide single crystal produced, the size of the above-mentioned reaction vessel, and the like.

The purity of the above-mentioned sublimation raw material is preferably higher from the stand point of preventing contamination of polycrystals and polymorphs into a silicon carbide single crystal produced as much as possible, and specifically, it is preferable that the content of each impurity element is 0.5 ppm or less.

Here, the content of the above-mentioned impurity elements is impurity content by chemical analysis, and only means a reference values, and practically, evaluation differs depending on whether the above-mentioned impurity elements are uniformly distributed in the above-mentioned silicon carbide single crystal or not, or whether they are localized or not. Here, "impurity element" means elements belonging to Groups I to XVII in the Periodic Table according to 1989, IUPAC Inorganic Chemical Nomenclature Revision and at the same time having an atomic number of 3 or more (excluding carbon atom, oxygen atom and silicon atom). When dopant elements such as nitrogen, aluminum and the like are added by intention for imparting n-type or p-type conductivity to a silicon carbide single crystal to be grown, these elements are also excluded.

A silicon carbide powder as the above-mentioned sublimation raw material is obtained, for example, by dissolving at least one silicon compound as a silicon source, at least one organic compound generating carbon by heating as a carbon source, and a polymerization catalyst or cross-linking catalyst in a solvent and drying the resulted solution to give a powder, and calcinating the resulted powder under a non-oxidaing atmosphere.

As the above-mentioned silicon compound, liquid compounds and solid compounds can be used together, however, at least one compound is selected from liquid compounds.

As the above-mentioned liquid compound, alkoxysilanes and alkoxysilane polymers are suitably used.

As the above-mentioned alkoxysilane, for example, methoxysilane, ethoxysilane, propoxysilane, butoxysilane and the like are listed, and among them, ethoxysilane is preferable from the standpoint of handling.

The above-mentioned alkoxysilane may be any of monoalkoxysilanes, dialkoxysilane, trialkoxysilane and tetraalkoxysilane, and tetraalkoxysilanes are preferable.

As the above-mentioned alkoxysilane polymer, lower molecular weight polymers (oligomers) having a degree of polymerization of from about 2 to 15 and silicic acid polymers are listed. For example, a tetraethoxysilane oligomer is mentioned.

As the above-mentioned solid compound, silicon oxides such as SiO, silica sol (colloidal ultrafine silica-containing liquid, having an OH group and alkoxyl group inside), silicon dioxides (silica gel, fine silica, quartz powder) and the like are listed.

The above-mentioned silicon compounds may be used alone or in combination of two or more.

Among the above-mentioned silicon compounds, a tetraethoxysilane oligomer, a mixture of a tetraethoxysilane oligomer and fine powdery silica, and the like are preferable from the standpoint of excellent uniformity and handling property.

The above-mentioned silicon compound preferably has high purity, and the content of each impurity at the initial period is preferably 20 ppm or less, more preferably 5 ppm or less.

As the above-mentioned organic compound generating carbon by heating, a liquid organic compound may be used alone and a liquid organic compound and a solid organic compound may be used together.

As the above-mentioned organic compound generating carbon by heating, organic compounds manifesting high carbon-remaining ratio and being polymerized or crosslinked by a catalyst or heat are preferable, and for example, monomers and prepolymers of phenol resins, furan resins, resins such as polyimides, polyurethanes, polyvinyl alcohol and the like, are preferable, and additionally, liquid substances such as cellulose, sucrose, pitch, tar and the like are mentioned. Among them, those of high purity are preferable, phenol resins are more preferable, and resol type phenol resins are particularly preferable.

The above-mentioned organic compound generating carbon by heating may be used alone or in combination of two or more.

The purity of the above-mentioned organic compound generating carbon by heating can be appropriately selected depending on the object, and when a high purity silicon carbide powder is necessary, it is preferable to use organic compounds in which the content of each metal is not 5 ppm or more.

The above-mentioned polymerization catalyst and crosslinking catalyst can be appropriately selected depending on the above-mentioned organic compound generating carbon by heating, and when the above-mentioned organic compound generating carbon by heating is a phenol resin or furan resin, acids such as toluenesulfonic acid, toluenecarboxylic acid, acetic acid, oxalic acid, maleic acid, sulfuric acid and the like are preferable, and maleic acid is particularly preferable.

The ratio of carbon contained in the above-mentioned organic compound generating carbon by heating to silicon contained in the above-mentioned silicon compound (hereinafter, abbreviated as C/Si ratio) is defined by element-analyzing a carbide intermediate obtained by carbonizing a mixture of them at 1000° C. Stoichiometrically, the content of free carbon in a silicon carbide powder obtained when the above-mentioned C/Si ratio is 3.0 should be 0%, however, free carbon generates at lower C/Si ratio by vaporization of a simultaneously produced SiO gas, actually. It is preferable to previously determine the compounding ratio so that the amount of free carbon in the resulted silicon carbide powder is suitable amount. Usually, by calcinations at 1600° C. or higher at around 1 atm, free carbon can be controlled when the above-mentioned C/Si ratio is 2.0 to 2.5. When the above-mentioned C/Si ratio is over 2.5, the above-mentioned free carbon increases remarkably. However, when calcinations is conducted at lower atmosphere pressure or higher atmosphere pressure, the C/Si ratio for obtaining a pure silicon carbide powder varies, therefore, the ratio is not necessarily limited in the above-mentioned C/Si range, in this case.

The above-mentioned silicon carbide powder is obtained also by hardening a mixture of the above-mentioned silicon compound and the above-mentioned organic compound generating carbon by heating, for example.

As the above-mentioned hardening method, a method of hardening by heating, a method of hardening by a hardening catalyst, methods using electronic beam and radiation, and the like are listed.

The above-mentioned hardening catalyst can be appropriately selected depending on the kind of the above-mentioned organic compound generating carbon by heating, and the like, and in the case of a phenol resin or furan resin, acids such as toluenesulfonic acid, toluenecarboxylic acid, acetic acid, oxalic acid, hydrochloric acid, sulfuric acid, maleic acid and the like, amic acids such as hexamine, and the like are suitably listed. When these hardening catalysts are used, the hardening catalyst is dissolved or dispersed in a solvent. As the above-mentioned catalyst, lower alcohols (for example, ethyl alcohol and the like), ethyl ether, acetone and the like are listed.

A silicon carbide powder obtained as described above is calcinated in a non-oxidizing atmosphere such as nitrogen, argon and the like at 800 to 1000° C. for 30 to 120 minutes.

By the above-mentioned calcinations, the above-mentioned silicon carbide powder becomes a carbide, and by calcinating this carbide in a non-oxidizing atmosphere such as argon and the like at 1350 to 2000° C., a silicon carbide powder is produced.

The temperature and time of the above-mentioned calcinations can be appropriately selected depending on the granular size of a silicon carbide powder to be obtained, and the above-mentioned temperature is preferably from 1600 to 1900° C. from the standpoint of more effective production of a silicon carbide powder.

For the purpose of removing impurities and obtaining a high purity silicon carbide powder, after the above-mentioned calcinations, it is preferable to conduct heat treatment at 2000 to 2400° C. for 3 to 8 hours.

Since the silicon carbide powder obtained as described above has non-uniform size, given particle size can be obtained by powder destruction, classification and the like.

The average particle size of the above-mentioned silicon carbide powder is preferably from 10 to 700 μm, more preferably from 100 to 400 μm.

When the above-mentioned average particle size is less than 10 μm, sintering occurs quickly at the sublimation temperature (1800 to 2700° C.) of silicon carbide for growing a silicon carbide single crystal, therefore, sublimation surface area decreases and growth of a silicon carbide single crystal delays, in some cases, and when a silicon carbide powder is accommodated in the above-mentioned reaction vessel and when the pressure of a re-crystallization atmosphere is changed for control of the growth speed, a silicon carbide powder is splashed easily. On the other hand, when the above-mentioned average particle size is over 500 μm, the specific surface area of a silicon carbide powder itself decreases, therefore, growth of a silicon carbide single crystal may delay also in this case.

As the above-mentioned silicon carbide powder, any of 4H, 6H, 15R, 3C and mixtures of them may be used. The grade of the above-mentioned 3C silicon carbide powder is not particularly restricted, and those generally marketed may be permissible, however, those of high purity are preferable.

Further, nitrogen or aluminum and the like can be introduced into a silicon carbide single crystal grown using the above-mentioned silicon carbide powder for the purpose of giving n type or p type conductivity, and when nitrogen or aluminum is introduced in generating the above-mentioned silicon carbide powder, it is recommendable that, first, the above-mentioned silicon source, the above-mentioned carbon source, an organic substance composed of a nitrogen source or aluminum source, the above-mentioned polymerization catalyst or crosslinking catalyst are uniformly mixed. In this case, it is preferable that, for example, when a carbon source such as phenol resins and the like, an organic substance composed of a nitrogen source such as hexamethylenetetramine and the like and a polymerization or crosslinking catalyst such as maleic acid and the like are dissolved in a solvent such as ethanol and the like, they are mixed sufficiently with a silicon source such as a tetraethoxysilane oligomer and the like.

As the above-mentioned organic substance composed of a nitrogen source, substances generating nitrogen by heating are preferable, and listed are, for example, polymer compounds (specifically, polyimide resins, nylon resins and the like), various amines such as organic amines (specifically, hexamethylenetetramine, ammonia, triethylamine, and the like, and compounds and salts of them). Of them, hexamethylenetetramine is preferable. A phenol resin synthesized using hexamine as a catalyst and containing nitrogen derived from this synthesis process in an amount of 2.0 mmol or more based on 1 g of the resin can also be suitably used as the organic substance composed of a nitrogen source. These organic substances composed of a nitrogen source may be used alone or in combination of two or more. The above-mentioned organic substance composed of an aluminum source is not particularly restricted and can be appropriately selected depending on the object.

Regarding the addition amount of the above-mentioned organic substance composed of a nitrogen source, when the above-mentioned silicon source and the above-mentioned carbon source are added simultaneously, nitrogen is contained in an amount of preferably 1 mmol or more based on 1 g of the above-mentioned silicon source, and the organic substance is added in an amount of 80 to 1000 μg based on 1 g of the above-mentioned silicon source.

-Sublimation-

It is preferable to conduct sublimation of the above-mentioned sublimation raw material by using a separate heating means from a heating means for effecting heating necessary for re-crystallization, from the standpoints of precise control and independent control of the heating means and prevention of interference and the like. In this embodiment, the number of heating means is two or more, and two heating means are preferably used in the present invention.

In the preferable embodiment in which two of the above-mentioned heating means are used, a heating means for forming a sublimation atmosphere enabling sublimation of the above-mentioned sublimation raw material is a first heating means and a heating means for forming the above-mentioned re-crystallization atmosphere enabling re-crystallization of the above-mentioned sublimation raw material being sublimate only around the above-mentioned seed crystal of a silicon carbide single crystal is a second heating means.

The above-mentioned first heating means is placed at the one end (sublimation raw material accommodating part) side of the above-mentioned reaction vessel, forms a sublimation atmosphere so as to enable sublimation of the above-mentioned sublimation raw material, and heats the above-mentioned sublimation raw material to cause sublimation.

The above-mentioned first heating means is not particularly restricted and can be appropriately selected depending on the object, and for example, induction heating means, resistance heating means and the like are listed, and the induction heating means are preferable since temperature control is easy, and among the induction heating means, induction-heatable coils are preferable.

When the above-mentioned first heating means is an induction-heatable coil, the number of winding is not particularly restricted and can be determined so that heating efficiency and temperature efficiency are optimum depending on the distance from the above-mentioned second heating means, the material of the above-mentioned reaction vessel, and the like.

-Growth of Silicon Carbide Single Crystal-

Growth of the above-mentioned silicon carbide single crystal is conducted on a seed crystal of a silicon carbide single crystal placed on the above-mentioned another end (seed crystal placing part) of the above-mentioned reaction vessel.

Regarding the above-mentioned seed crystal of a silicon carbide single crystal, the polymorphs, size and the like of the crystal can be appropriately selected depending on the object, and as the polymorphs of the crystal, the same polymorph as that of a silicon carbide single crystal to be obtained is selected, usually.

For re-crystallizing and growing the above-mentioned silicon carbide single crystal on the above-mentioned seed crystal, it is preferable to form a re-crystallization atmosphere having temperature lower than the temperature for sublimation of the above-mentioned sublimation raw material and enabling re-crystallization of the above-mentioned sublimation raw material being sublimate only around the above-mentioned seed crystal (in other words, temperature distribution and atmosphere so that temperature becomes lower when approximating the center part (center of the inside region), along the diameter direction of a surface on which the above-mentioned seed crystal is placed).

Formation of the above-mentioned re-crystallization atmosphere can be more suitably conducted by the above-mentioned second heating means. Such a second heating means is placed at another end (seed crystal placing part) side of the above-mentioned reaction vessel and forms a re-crystallization atmosphere so as to enable re-crystallization of the above-mentioned sublimation raw material being sublimate by the above-mentioned first heating means only around the seed crystal of a silicon carbide single crystal, and causes re-crystallization of the sublimation raw material on the above-mentioned seed crystal of a silicon carbide single crystal.

The above-mentioned second heating means is not particularly restricted and can be appropriately selected depending on the object. For example, induction heating means, resistance heating means and the like are listed, and the induction heating means are preferable since temperature control is easy, and among the induction heating means, induction-heatable coils are preferable.

When the above-mentioned second heating means is an induction-heatable coil, the number of winding is not particularly restricted and can be determined so that heating efficiency and temperature efficiency are optimum depending on the distance from the above-mentioned first heating means, the material of the above-mentioned reaction vessel, and the like.

The quantity of induction heating current flowing through the above-mentioned second heating means can be appropriately determined depending on relation with the quantity of induction heating current flowing through the above-mentioned first heating means, and regarding the relation of them, it is preferable that the current value of induction heating current in the above-mentioned first heating means is larger than the current value of induction heating current in the above-mentioned second heating means. This case is advantage in that the temperature of a re-crystallization atmosphere around on the above-mentioned seed crystal is maintained lower than the temperature of an atmosphere in which the above-mentioned sublimation raw material sublimates, and re-crystallization is conducted easily.

It is preferable to control the current value of induction heating current in the above-mentioned second heating means so that it decreases continuously or gradually when the diameter of a silicon carbide single crystal to be grown increases. In this case, the heating quantity by the above-mentioned second heating means is controlled small when the above-mentioned silicon carbide single crystal grows, consequently, re-crystallization is conducted only around the above-mentioned silicon carbide single crystal keeping growing, and formation of polycrystals around the silicon carbide single crystal is effectively suppressed, advantageously.

A preferable tendency is obtained when the current value of induction heating current in the above-mentioned second heating means is controlled small when the diameter of the above-mentioned seed crystal of a silicon carbide single crystal is large and controlled large when the above-mentioned diameter is small.

In the present invention, the above-mentioned second heating means can be controlled independently from the above-mentioned first heating means, therefore, preferable growth speed can be maintained through the all growth processes of a silicon carbide single crystal by appropriately controlling the heating quantity of the second heating means depending on the growth speed of a silicon carbide single crystal.

The temperature of a re-crystallization atmosphere formed by the above-mentioned second heating means is lower than the temperature of the above-mentioned sublimation atmosphere formed by the above-mentioned first heating means by preferably 30 to 300° C., more preferably 30 to 150° C.

The pressure of a re-crystallization atmosphere formed by the above-mentioned second heating means is preferably from 10 to 100 Torr (1330 to 13300 Pa). When this pressure condition is applied, it is preferable that pressure reduction is not effected at ambient temperature, and after heating to given temperature, pressure reduction is effected to control pressure condition so as to fall within the above-mentioned given numerical value range.

It is preferable that the above-mentioned re-crystallization atmosphere is an inert gas atmosphere composed of an argon gas and the like.

In the present invention, it is preferable from the standpoint of obtaining a silicon carbide single crystal having large diameter that temperature at one end (sublimation raw material accommodating part) side accommodating a sublimation raw material, in the above-mentioned reaction vessel, controlled by the above-mentioned first heating means, temperature of the center part at another end (seed crystal placing part) side carrying the above-mentioned seed of a silicon carbide single crystal placed, in the above-mentioned reaction vessel, controlled by the above-mentioned second heating means, and temperature of parts situated at the outside of the center part and adjacent to the inner peripheral surface part of the reaction vessel are controlled in a relation described below. Namely, it is preferable to conduct control so that, if the temperature at one end side accommodating a sublimation raw material is represented by $T_1$, the temperature at another end side at which a seed crystal of a silicon carbide single crystal is placed is represented by $T_2$, and the temperature of parts adjacent to the inner peripheral surface part of the reaction vessel, at another end side, is represented by $T_3$, then, $T_3-T_2$ and $T_1-T_2$ increase continuously or gradually.

In this case, since $T_1-T_2$ increases continuously or gradually, even if a silicon carbide single crystal keeps on growing toward the above-mentioned one end side with the lapse of time, the peak side of crystal growth of the silicon carbide single crystal is usually maintained at condition liable to cause re-crystallization. On the other hand, since $T_3$–$T_2$ increases continuously or gradually, even if a silicon carbide single crystal keeps on growing toward the outer peripheral direction at above-mentioned another end side with the lapse of time, the outer peripheral end side of crystal growth of the silicon carbide single crystal is usually maintained at condition liable to cause re-crystallization. As a result, production of a silicon carbide single crystal is effectively suppressed, and the silicon carbide single crystal keeps on growing toward the direction of increasing its thickness while enlarging its diameter, finally, a silicon carbide single crystal having large diameter is obtained without contamination of a silicon carbide polycrystal and the like, advantageously.

In the present invention, the above-mentioned silicon carbide single crystal re-crystallizes and grows according to the above-mentioned first to third embodiments.

In the above-mentioned first embodiment, the above-mentioned silicon carbide single crystal is allowed to grow while keeping the whole surface of its growth surface in convex shape through the all growth processes. In this case, a concave portion sunk toward the above-mentioned another end (seed crystal placing part) side is not shaped in the form of ring, at the whole surface of the growth surface of the silicon carbide single crystal.

In the above-mentioned second embodiment, growth of the above-mentioned silicon carbide single crystal is conducted only in the region excepting parts adjacent to the peripheral surface part in the reaction vessel (inside region), at the above-mentioned end of the above-mentioned reaction vessel. In this case, a silicon carbide polycrystal does not grow contacting with the peripheral surface part in the reaction vessel, at the above-mentioned another end (seed crystal placing part). Therefore, when a silicon carbide single crystal grown is cooled to room temperature, stress based on a difference in thermal expansion does not concentrate from the silicon carbide polycrystal side to the silicon carbide single crystal side, and breakages such as cracking and the like do not occur on the resulted silicon carbide single crystal.

In the above-mentioned third embodiment, the above-mentioned silicon carbide single crystal is grown only at the region excepting parts adjacent to the peripheral surface part of in the reaction vessel (inside region), at the above-mentioned end of the above-mentioned reaction vessel, while keeping the whole surface of its growth surface in convex shape through the all growth processes.

In this case, a concave portion sunk toward to the above-mentioned another end (seed crystal placing part) side of the above-mentioned reaction vessel is not shaped in the form of ring at the whole surface of its growth surface of the above-mentioned silicon carbide single crystal, and a silicon carbide single crystal does not grow contacting with the peripheral surface part in the reaction vessel, at the above-mentioned another end (seed crystal placing part). Therefore, when a silicon carbide single crystal grown is cooled to room temperature, stress based on a difference in thermal expansion does not concentrate from the silicon carbide polycrystal side to the silicon carbide single crystal side, and breakages such as cracking and the like do not occur on the resulted silicon carbide single crystal.

Regarding the form of the above-mentioned silicon carbide single crystal to be grown, it is preferable that the whole surface of its growth surface is in convex form toward its growth direction side, and when the above-mentioned one end (sublimation raw material accommodating part) faces the above-mentioned another end (seed crystal placing part), it is preferable that the whole surface of its growth surface is in convex form toward the above-mentioned sublimation raw material side, namely, toward the above-mentioned one end (sublimation raw material accommodating part) side.

This case is preferable in that a concave portion sunk toward the above-mentioned another end (seed crystal placing part) side is not present, on which contamination of polycrystals and polymorphs is significant and concentration of stress based on a difference in thermal expansion is believed to be easy.

Regarding the form of the above-mentioned silicon carbide single crystal to be grown, it may not in the above-mentioned convex form or a flat portion may be partially contained, providing the whole surface of its growth surface does not contain a part sunk toward the reverse side to its growth direction side.

The form of a silicon carbide crystal containing a silicon carbide single crystal is preferably in angle form toward the above-mentioned sublimation raw material side, namely, toward the above-mentioned one end side, and an approximate protruded shape having diameter decreasing gradually is more preferable. In other words, it is preferable that a silicon carbide crystal containing a silicon carbide single crystal is allowed to grow while keeping approximate protruded shape having diameter decreasing gradually when approximating the sublimation raw material side, through the all growth processes.

In skirt parts of a silicon carbide crystal in the form of the above-mentioned approximate protruded shape, namely, at outer peripheral parts, silicon carbide polycrystals and polymosphism may be mixed, however, generation of this mixing can be prevented by combination of the thickness, size, form and the like of the above-mentioned seed crystal with the heating quantity by the above-mentioned second heating means. Prevention of the contamination of silicon carbide polycrystals and polymorphs is preferable since then the above-mentioned silicon carbide crystal containing silicon carbide can be made only of a silicon carbide single crystal.

In the present invention, a plate member in the form of ring may also be fixed and placed on the peripheral surface part in the above-mentioned reaction vessel, approximately in parallel to the above-mentioned another end (seed crystal placing part). In this case, when the above-mentioned silicon carbide single crystal is re-crystallized and grown on the above-mentioned seed crystal, only the above-mentioned silicon carbide single crystal can be re-crystallized and grown on the above-mentioned seed crystal, and a silicon carbide polycrystal is not allowed to grow or can be deposited selectively on the above-mentioned plate member in the form of ring. In this case, the diameter of the resulting silicon carbide single crystal is constrained corresponding to the size of the above-mentioned plate member in the form of ring.

In the present invention, it is preferable, for the purpose of effecting efficient growth of the above-mentioned silicon carbide single crystal, to use an interference preventing means for preventing interference between the above-mentioned first heating means and the above-mentioned second heating means.

The above-mentioned interference preventing means is not particularly restricted and can be appropriately selected depending on the kind of the above-mentioned first heating means and the above-mentioned second heating means, and the like, and for example, interference preventing coils, interference preventing plates and the like are listed, and when the above-mentioned first heating means and the above-mentioned second heating means are the above-mentioned induction-heatable coil, interference preventing coils and the like are suitably listed.

The above-mentioned interference preventing coil (simply called as "coil" in some cases) is preferably a coil through which induction current flows and having a function of preventing interference between the above-mentioned first heating means and the above-mentioned second heating means by flowing induction current.

The above-mentioned interference preventing coil is preferably placed between the above-mentioned first heating means and the above-mentioned second heating means. This case is preferable in that, when induction heating is conducted by the above-mentioned first heating means and the above-mentioned second heating means simultaneously, induction current flow through the interference preventing coil, and the interference preventing coil can minimize and prevent interference between them.

The above-mentioned interference preventing coil is preferably designed so that it is not heated by induction current flowing through itself, a self-coolable coil is more preferable, and a coil through which a cooling medium such as water and the like can flow is particularly preferable. This case is preferable in that, even if induction current in the above-mentioned first heating means and the above-mentioned second heating means flows through the interference preventing coil, the interference preventing coil is not heated, therefore, the above-mentioned reaction vessel is also not heated.

The number of winding of the above-mentioned wound interference preventing coil is not particularly restricted and differs depending on the kind of the above-mentioned first heating means and the above-mentioned second heating means and the amount of current flowing through them, and the like and can not be limited to a constant range, namely, even a single coil is sufficient.

As described above, according to the method of producing a silicon carbide single crystal of the present invention, the silicon carbide single crystal of the present invention having high quality can be easily produced efficiently and in condition showing no breakages such as cracking and the like.

(Silicon Carbide Single Crystal)

The silicon carbide single crystal of the present invention is produced by the method of producing a silicon carbide single crystal of the present invention described above.

In the silicon carbide single crystal of the present invention, the crystal defects (pipe defect) of which image is optically detected non-destructively is preferably 100/cm$^2$ or less, more preferably 50/cm$^2$ or less, particularly preferably 10/cm$^2$ or less.

The above-mentioned crystal defect can be detected, for example, by the following manner. Namely, illumination prepared by adding suitable amount of transmission illumination to reflection illumination is allowed to irradiate the silicon carbide single crystal, and the focus of a microscope is adjusted to an opening of crystal defect (pipe defect) on the surface of the silicon carbide single crystal, then, portions continuing to the inside of the pipe defect can be observed as shadow weaker than an image of the opening, connected to the opening. Under such conditions, the whole surface of the silicon carbide single crystal is scanned to obtain a microscope image, then, this microscope image is image-treated, and only forms characteristic to the pipe defect are extracted and the number of them are counted. Thus, the pipe defect can be detected.

According to the above-mentioned detection, only the above-mentioned pipe defect can be correctly detected, from a mixture of defects other than the above-mentioned pipe defect, such as extraneous substances adhered to the surface of the above-mentioned silicon carbide single crystal, polishing flaw, void defect and the like, further, even fine pipe defects of about 0.35 μm can be detected correctly. On the other hand, there is conventionally conducted a method in which the above-mentioned pipe defect parts are selectively etched, and detected in magnification, however, this method has a problem that, adjacent pipe defects described above join mutually, and resultantly, smaller number of defects than the real number of the pipe defects is detected.

The total content of the above-mentioned impurity elements in the above-mentioned silicon carbide single crystal is preferably 10 ppm or less.

The silicon carbide single crystal of the present invention contains no crystal defects such as contamination of polycrystals and polymorphs and micropipes and the like and has extremely high quality, therefore, it is excellent in dielectric breakdown property, heat resistance, radiation resistance and the like and particularly suitable for electronic devices such as semiconductor wafers and the like and optical devices such as light emitting diodes and the like.

(Silicon Arbide Single Crystal Production Apparatus)

With the apparatus for generating a silicon carbide single crystal of the present invention, the above-mentioned sublimation raw material being sublimate is re-crystallized to grow a silicon carbide single crystal, generating the silicon carbide single crystal of the present invention.

The above-mentioned apparatus for generating a silicon carbide single crystal comprises at least a crucible, a first induction heating coil and a second induction heating coil, and if necessary, other members appropriately selected, and the like.

The above-mentioned crucible is not particularly restricted and can be appropriately selected from known products, and in general, comprises a vessel body and a cover body.

The material of the above-mentioned crucible is not particularly restricted and can be appropriately selected from known materials, and graphite is particularly preferable.

The above-mentioned vessel body is not particularly restricted providing it has a function capable of accommodating the above-mentioned sublimation raw material, and known products can be adopted.

The above-mentioned cover body is preferably attachable to and detachable from the above-mentioned vessel body, and known products can be adopted. The above-mentioned vessel body and the above-mentioned cover body may be designed so that attachable and detachable by any of engagement, spiral fitting and the like, and spiral fitting is preferable.

In the above-mentioned apparatus for generating a silicon carbide single crystal, usually, when the above-mentioned cover body is installed to the above-mentioned vessel body, a seed crystal of the above-mentioned silicon carbide single crystal is placed at approximately the center of a surface facing the above-mentioned sublimation raw material accommodated in the vessel body.

The above-mentioned first induction heating coil is not particularly restricted providing it generates heat by flow of current and can form a sublimation atmosphere so as to enable sublimation of the above-mentioned sublimation raw material, and induction heatable coils and the like are suitably listed.

The above-mentioned first induction heating coil is placed in condition wound around the outer periphery of a part accommodating the above-mentioned sublimation raw material, in the above-mentioned crucible.

The above-mentioned second induction heating coil is not particularly restricted providing it can form a re-crystallization atmosphere so that the above-mentioned sublimation raw material being sublimate by the above-mentioned first induction heating coil can re-crystallize only around the above-mentioned seed crystal of silicon carbide, to re-crystallize the sublimation raw material on the above-mentioned seed crystal of silicon carbide, and induction-heatable coils and the like are listed.

The above-mentioned second induction heating coil is placed in condition wound around the outer periphery of a part on which the above-mentioned seed crystal of silicon carbide is placed, in the above-mentioned crucible.

In the above-mentioned silicon carbide single crystal production apparatus, the above-mentioned first induction heating coil forms a sublimation atmosphere so as to enable sublimation of the above-mentioned sublimation raw material, to sublimate the above-mentioned sublimation raw material. The above-mentioned second induction heating coil forms a re-crystallization atmosphere so that the above-mentioned sublimation raw material being sublimate by the above-mentioned first induction heating coil can be re-crystallized only around the above-mentioned seed crystal, to re-crystallize the sublimation raw material on the above-mentioned seed crystal. Therefore, the whole surface of its growth surface of a silicon carbide single crystal to be grown is maintained in convex form toward its growth direction in the all growth processes, a concave portion sunk toward the above-mentioned cover body is not shaped in the form of ring, and silicon carbide polycrystal does not grow contacting the peripheral surface part in the above-mentioned vessel body. Therefore,when a silicon carbide single crystal grown is cooled to room temperature, stress based on a difference in thermal expansion does not concentrate from the silicon carbide polycrystal side to the silicon carbide single crystal side, and breakages such as cracking and the like do not occur on the resulted silicon carbide single crystal. As a result, a high quality silicon carbide single crystal can be efficiently and securely produced having no conventional various problems described above, namely, having no breakages such as cracking and the like and crystal defects such as contamination of polycrystals and polymorphs and micropipes and the like present.

As described above, according to the silicon carbide single crystal production apparatus for the present invention, the silicon carbide single crystal of the present invention having high quality can be produced efficiently and easily without breakages such as cracking and the like.

EXAMPLES

The following examples will described the present invention, but do not limit the scope of the invention at all.

Example 1

Using a silicon carbide single crystal production apparatus 1 shown in FIG. 1, a silicon carbide single crystal was produced. Use of the silicon carbide single crystal production apparatus 1 leads to execution of the silicon carbide single crystal production method of the present invention.

The silicon carbide single crystal production apparatus 1 comprises a graphite crucible 10 having a vessel body 12 capable of accommodating a sublimation raw material 40 and a cover body 11 which can be attached to and detached from the vessel body 12 by spiral fitting, and in which, when installed on the vessel body 12, a seed crystal 50 of a silicon carbide single crystal can be placed approximately at the center of a surface facing the sublimation raw material 40 accommodated in the vessel body 12; a supporting rod 31 fixing the graphite crucible 10 to inside of a quartz tube 30; a first induction heating coil 21 placed at a part which is on the outer periphery of the quartz tube and in which the sublimation raw material 40 is accommodated, in the graphite crucible 10; and a second induction heating coil 20 placed at a part which is on the outer periphery of the quartz tube 30 and on which the cover body 11 is situated, in the graphite crucible 10. The graphite crucible 10 is covered with an insulation material (not shown).

The sublimation raw material 40 is a silicon carbide powder (6H (partially containing 3C), average particle size: 200 μm) obtained by using a high purity tetraethoxysilane polymer described above as a silicon source, a resol type phenol resin as a carbon source, and mixing them uniformly to obtain a mixture, calcinating the mixture by heating under an argon atmosphere, and the seed crystal 50 of a silicon carbide single crystal is a Rayleigh crystal of 6H.

In the silicon carbide single crystal production apparatus 1, electric current was allowed to flow through the first induction heating coil 21. By this heat, the sublimation raw material 40 was heated (after heating to 2500° C., pressure was maintained at 50 Torr (6645 Pa) by an argon gas atmosphere). The sublimation raw material 40 was heated up to given temperature (2500° C.) to show sublimation. The sublimation raw material 40 sublimated does not re-crystallize unless cooled to the re-crystallization temperature. Here, the cover body 11 side was heated by the second induction heating coil 20 and had temperature lower than the sublimation raw material 40 side (temperature of seed crystal is 2400° C.), and maintained in a re-crystallization atmosphere (pressure is 50 Torr (6645 Pa)) in which the sublimation raw material 40 sublimated can re-crystallize, therefore, silicon carbide re-crystallized only around on the seed crystal 50 of a silicon carbide single crystal, and a crystal of silicon carbide grew.

Figure 2:
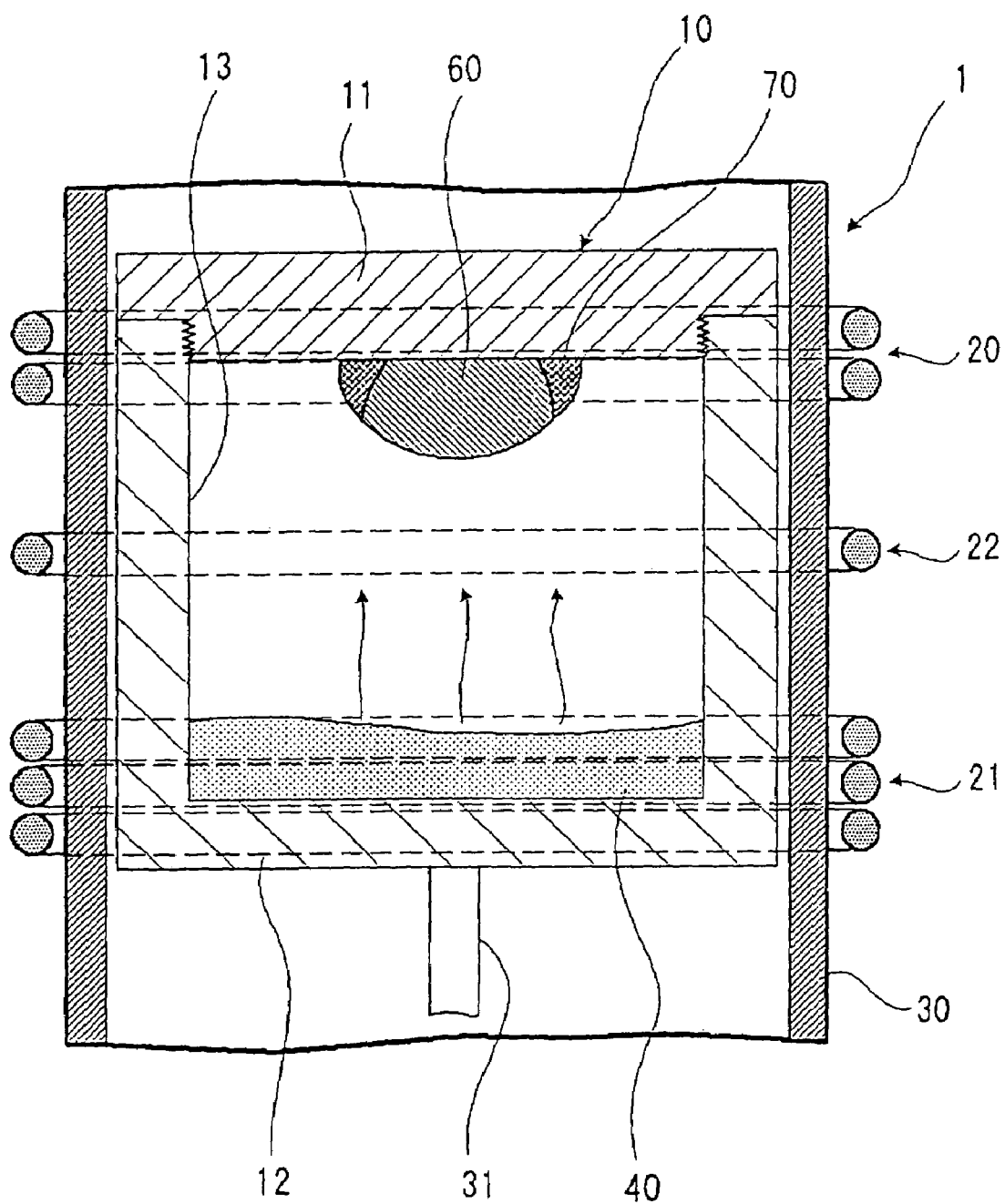
FIG. 2 is a schematic view for illustrating a condition in which a silicon carbide single crystal is being produced by the method of producing a silicon carbide single crystal of the present invention.

Here, a silicon carbide single crystal 60 re-crystallizes and grows on the seed crystal 50 of a silicon carbide single crystal, and a silicon carbide polycrystal 70 re-crystallizes and grows on the outer periphery on the seed crystal 50 of a silicon carbide single crystal, as shown in FIG. 2. In growth of the silicon carbide single crystal 60, a convex form was maintained toward the sublimation raw material 40 side in the all growth processes, and a concave portion sunk toward the cover body 11 side was no shaped in the form of ring, and the silicon carbide single crystal 70 did not grow contacting the peripheral surface part 13 in the vessel body 12.

Figure 3:
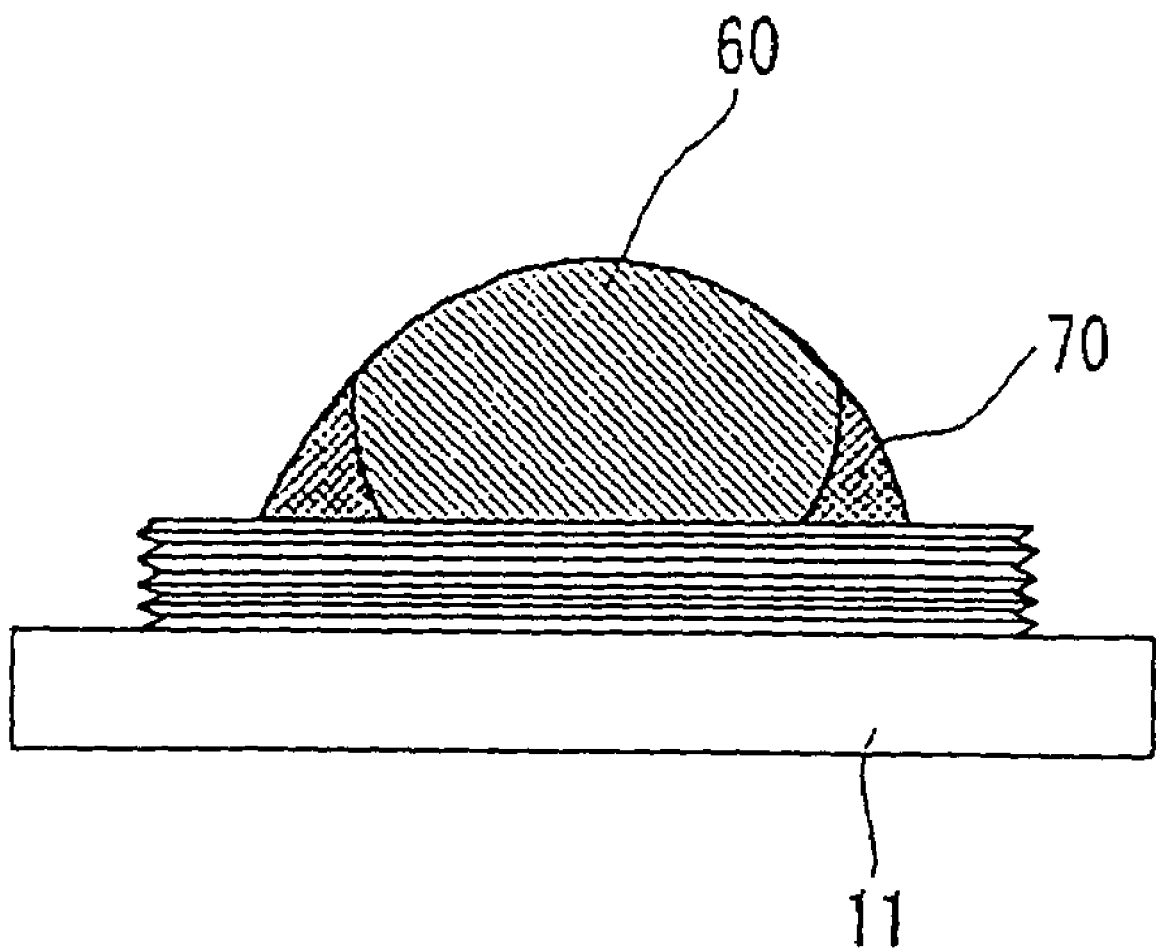
FIG. 3 is a schematic view of the silicon carbide single crystal of the present invention produced by the method of producing a silicon carbide single crystal of the present invention.

As a result, when the silicon carbide single crystal 60 grown was cooled to room temperature, stress based on a difference in thermal expansion was no applied in concentration from the silicon carbide polycrystal 70 side to the silicon carbide single crystal 60 side, and breakages such as cracking and the like did not occur on the resulted silicon carbide single crystal 60, as shown in FIG. 3.

When the resulted silicon carbide single crystal 60 was evaluated, contamination of polycrystals and polymorphs crystals was not found, and crystal defect of micropipes was as scarce as 4/cm$^2$, meaning extremely high quality.

The above-mentioned crystal defect of micropipes was detected as described below, after cutting the resulted silicon carbide single crystal 60 into a thickness of 0.4 mm, mirror polishing to give a wafer having a surface roughness of 0.4 nm, and removing extraneous substances on the surface as much as possible by alkali washing. Namely, illumination prepared by adding suitable amount of transmission illumination to reflection illumination was allowed to irradiate the above-mentioned wafer after alkali washing, the focus of a microscope was adjusted to an opening of micropipes on the wafer surface, then, portions continuing to the inside of the micropipe could be observed as shadow weaker than an image of the opening, connected to the opening. Under such conditions, the whole surface of the above-mentioned wafer was scanned to obtain a microscope image, then, this microscope image was image-treated, and only forms characteristic to the micropipe are extracted and the number of them were counted. Thus, the micropipes were detected. In this detection, even fine micropipes of about 0.35 μm were detected correctly without breakage.

Example 2

Figure 4:
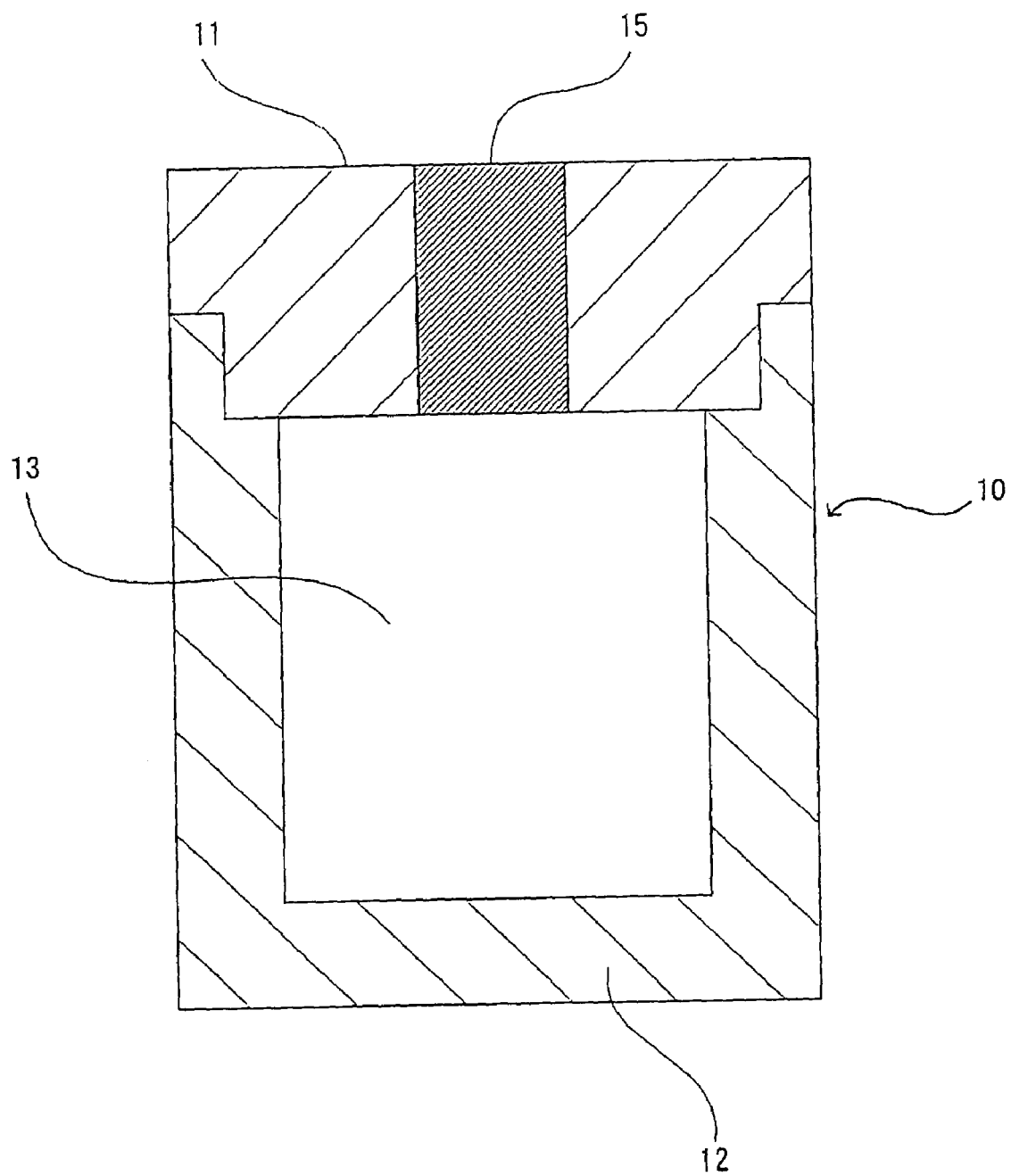
FIG. 4 is a schematic illustration view showing one example of the crucible used in the method of producing a silicon carbide single crystal of the present invention.

The same procedure as in Example 1 was conducted except that the graphite crucible 10 was changed to a graphite crucible 10 shown in FIG. 4 in Example 1. As a result, the same result as in Example 1 was obtained. The graphite crucible 10 shown in FIG. 4 differs from the graphite crucible 10 shown in FIG. 1 used in Example 1 only in that an inside region forming part 15 is provided in the cover body 11. The inside region forming part 15 is, as shown in FIG. 4, a cylinder having the above-mentioned inside region on which a seed crystal of a silicon carbide single crystal is placed as the bottom surface, and one end of which is exposed to outside of the graphite crucible 10. The material of inside region forming part 15 had a heat conductivity of 117 J/m/s/° C. (W/m·K), and the material of the cover body 11 other than inside region forming part 15 had a heat conductivity of 129 J/m/s/° C. (W/m·K).

In the case of Example 2, since the above-mentioned inside region is formed of a different member (inside region forming part 15) from that in the above-mentioned outside region, heating is difficult by a difference in contact resistance, and one end of the inside region forming part 15 is exposed to outside, heat is discharged to outside easily, therefore, re-crystallization of silicon carbide was conducted easily. cl Example 3

Figure 5:
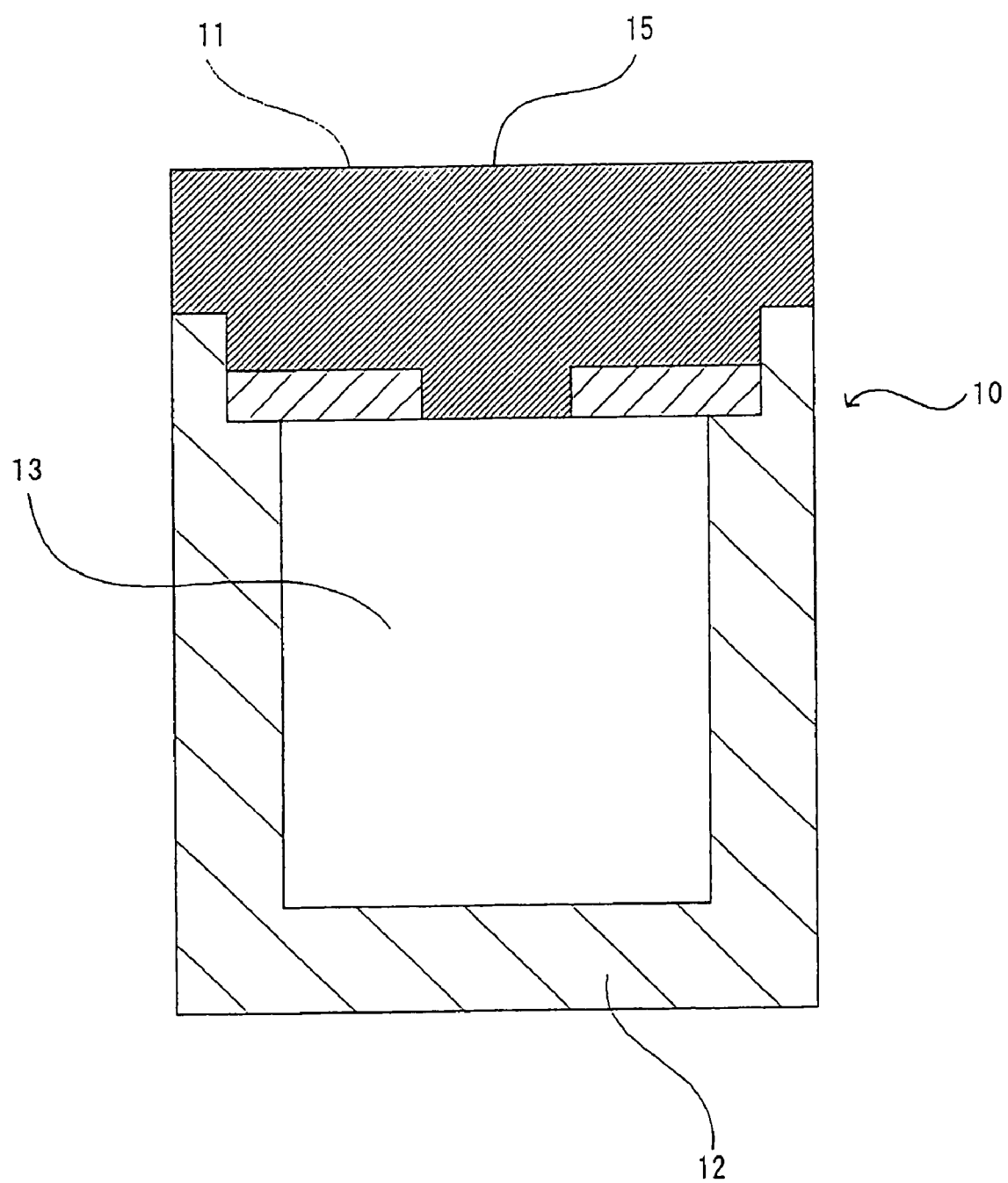
FIG. 5 is a schematic illustration view showing another example of the crucible used in the method of producing a silicon carbide single crystal of the present invention.

The same procedure as in Example 1 was conducted except that the graphite crucible 10 was changed to a graphite crucible 10 shown in FIG. 5 in Example 1. As a result, the same result as in Example 1 was obtained. The graphite crucible 10 shown in FIG. 5 differs from the graphite crucible 10 shown in FIG. 1 used in Example 1 only in that an inside region forming part 15 is provided in the cover body 11. The inside region forming part 15 has, as shown in FIG. 5, a form having the above-mentioned inside region on which a seed crystal of a silicon carbide single crystal is placed as the bottom surface, of which diameter increases discontinuously in two stages toward the above-mentioned outside, and one end of which is exposed to outside. The material of inside region forming part 15 had a heat conductivity of 117 J/m/s/° C. (W/m·K), and the material of the cover body 11 other than inside region forming part 15 had a heat conductivity of 129 J/m/s/° C. (W/m·K).

In the case of Example 3 since the above-mentioned inside region is formed of a different member from that in the above-mentioned outside region, heating is difficult by a difference in contact resistance, and one end of the inside region forming part 15 is exposed to outside, heat is discharged to outside easily, therefore, re-crystallization of silicon carbide was conducted easily.

Example 4

The same procedure as in Example 1 was conducted except the following point in Example 1. Namely, the resulted silicon carbide powder had 6H and an average particle size of 300 μm, and the seed crystal 50 of a silicon carbide single crystal is a 15R wafer (diameter: 40 mm, thickness 0.5 mm) obtained by cutting the bulk silicon carbide single crystal obtained in Example 1 and mirror-polishing the whole surface.

Figure 6:
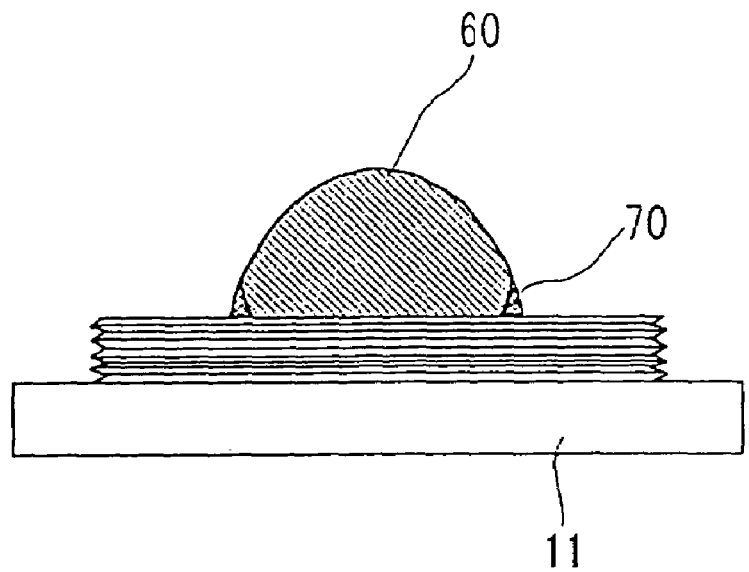
FIG. 6 is a schematic view of the silicon carbide single crystal of the present invention produced by the method of producing a silicon carbide single crystal of the present invention.

Current of 20 kHz was flown through a first induction heating coil 21 to heat, and current of 40 kHz was flown through a second induction heating coil 20 to heat to increase the temperature. The lower part of the graphite crucible 10 (part accommodating the sublimation raw material 40) was heated to 2312° C., and the upper part of the graphite crucible 10 (place on which the seed crystal 50 of a silicon carbide single crystal is placed in the cover body 11) was heated to 2290° C., respectively. In this operation, the feeding powder to the first induction heating coil 21 was 10.3 kW, and the induction heating current (feeding current to LC circuit) was 260 A, and the feeding power to the second induction heating coil 20 was 4.6 kW, and the induction heating current was 98 A. The pressure was reduced to 20 Torr (2658 Pa) from normal pressure over 1 hour, and maintained for 20 hours, to obtain a silicon carbide single crystal 60 of which convex form was maintained toward the sublimation raw material 40 side as shown in FIG. 6. In this situation, the height to the peak of the convex form in the silicon carbide single crystal 60 was 12 mm, and the diameter of a grown crystal of silicon carbide containing the silicon carbide single crystal 60 and a silicon carbide polycrystal formed around this was 87 mm. In the silicon carbide single crystal 60, a concave portion sunk toward the cover body 11 was not shaped in the form of ring. The silicon carbide single crystal 60 did not grow contacting the peripheral surface part 13 of the vessel body 12 of the graphite crucible 10. Further, a silicon carbide single crystal 70 generated only slightly around the silicon carbide single crystal 60.

Example 5

The same procedure as in Example 1 was conducted except the following point in Example 4. Namely, the procedure was as in Example 4 except that the seed crystal 50 of a silicon carbide single crystal had a diameter of 20 mm and a thickness of 0.5 mm, the lower part of the graphite crucible 10 (part accommodating the sublimation raw material 40) was heated to 2349° C., and heating temperature of the upper part of the graphite crucible 10 (place on which the seed crystal 50 of a silicon carbide single crystal is placed in the cover body 11) was 2317° C., and under these conditions, the feeding powder to the second induction heating coil 20 was 5.5 kW, the induction heating current was 118 A, and the diameter of a grown crystal of silicon carbide containing the silicon carbide single crystal 60 and a silicon carbide polycrystal formed around this was 60 mm, and the same excellent results were obtained as in Example 4.

Example 6

The same procedure as in Example 1 was conducted except the following point in Example 6. Namely, an interference preventing coil 22 was used in which water flows and which can be cooled. The resulted silicon carbide powder had 6H and an average particle size of 250 μm, and the seed crystal 50 of a silicon carbide single crystal is a wafer (6H) having a diameter of 25 mm and a thickness of 2 mm obtained by cutting the bulk silicon carbide single crystal obtained in Example 4 and mirror-polishing the whole surface.

Figure 7:
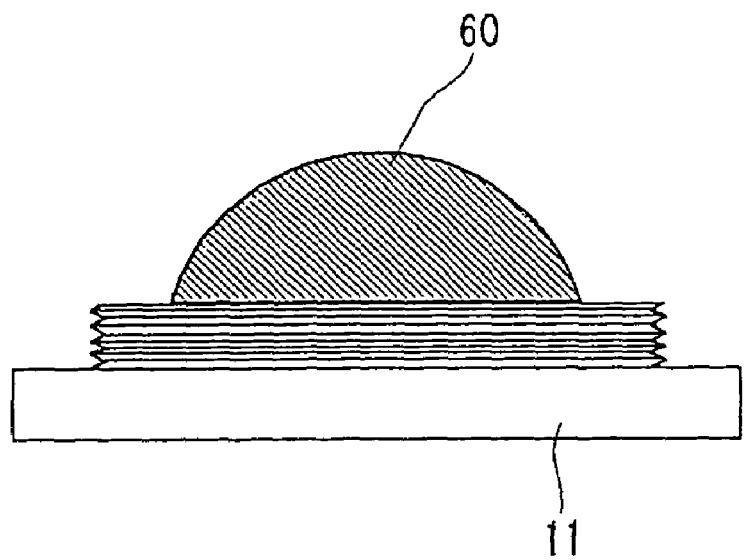
FIG. 7 is a schematic view of the silicon carbide single crystal of the present invention produced by the method of producing a silicon carbide single crystal of the present invention.

Current of 20 kHz was flown through a first induction heating coil 21 to heat, and current of 40 kHz was flown through a second induction heating coil 20 to heat. The lower part of the graphite crucible 10 (part accommodating the sublimation raw material 40) and the upper part of the graphite crucible 10 (place on which the seed crystal 50 of a silicon carbide single crystal is placed in the cover body 11) were heated to 2510° C., respectively, and heated for 1 hour. While maintaining the lower part of the graphite crucible 10 at the same temperature ($T_1$), the feeding power to the second induction heating coil 20 was gradually lowered (from 5.8 kW, 120 A, to 4.2 kW, 90 A), to lower the temperature of the seed crystal placing part of the cover body 11 of the graphite crucible 10 down to 2350° C. ($T_2$) over 20 hours and to lower the temperature of the outer peripheral part of the seed crystal placing part of the cover body 11 down to a calculated estimated temperature of 2480° C. ($T_3$), respectively. In this operation, the pressure was decreased simultaneously from normal pressure to 20 Torr (2658 Pa) over 1 hour, as a result, a silicon carbide single crystal 60 of which convex portion was maintained toward the sublimation raw material 40 side was obtained, as shown in FIG. 7. In this situation, the height to the peak of the convex form in the silicon carbide single crystal 60 was 18 mm. In the silicon carbide single crystal 60, a concave portion sunk toward the cover body 11 was not shaped in the form of ring. The silicon carbide single crystal 60 did not grow contacting the peripheral surface part 13 of the vessel body 12 of the graphite crucible 10. Further, a silicon carbide single crystal 70 did not generate or grow adjacent to and around the silicon carbide single crystal 60.

Example 7

The same procedure as in Example 1 was conducted except the following point in Example 1. Namely, the second induction heating coil 20 and the first induction heating coil 21 were substituted by an induction heating coil 25 in a conventional silicon carbide single crystal production apparatus 80 shown in FIG. 8, and only on outside regions of a circle having a radius of 60 mm from the center, of surfaces (surfaces on which growth of silicon carbide single crystal is conducted) facing the inside of the vessel body 12, on the cover body 11 of the graphite crucible, a carbon thin membrane which is judged to be glassy or amorphous by X ray diffraction was formed by the following method to give a thickness of 1 to 10 μm. Its was placed in a vacuum chamber while exposing only the above-mentioned outside regions on the cover body 11, and under a benzene atmosphere, the pressure in the chamber was controlled to 0.23 Pa. Then, the cover body 11 was kept at a negative potential of 2.5 kV, and by decomposing benzene by ark discharge plasma generated at a facing part of a filament and an anode, positive ions generated in plasma were allowed to collide against the above-mentioned outer regions on the cover body 11 at high speed, to effect membrane formation.

In Example 7, a crystal of silicon carbide did not grow on a part on which membrane formation of glassy carbon or amorphous carbon was effected, on a surface of the side facing to the inside of the vessel body 12 in the cover body 11, and only on the center part (circular part having a diameter of 60 mm) on which membrane formation was not effected, a silicon carbide single crystal 60 grew of which whole surface of its growth surface was maintained in convex form toward the sublimation raw material 40 side. Therefore, the silicon carbide single crystal 60 did not grow contacting the peripheral surface part 13 of the vessel body 12 in the graphite crucible 10, and when cooled to room temperature, breakages such as cracking and the like did not occur.

Comparative Example 1

A silicon carbide single crystal was produced in the same manner as in Example 1 except that a silicon carbide single crystal production apparatus 80 shown in FIG. 6 was used.

Specifically, the same procedure was conducted as in Example 1 except that the first induction heating coil 21 and the second induction heating coil 20 placed at a pat which is situated at the outer periphery of the quartz tube 30 and on which the cover body 11 in the graphite crucible 10 is situated were substituted by induction heating coils 25 placed under condition wound in spiral form at approximately the same interval at a part which is situated at the outer periphery of the quartz tube 30 and on which the graphite crucible 10 is situated, and the interference preventing coil 22 was not used.

Figure 8:
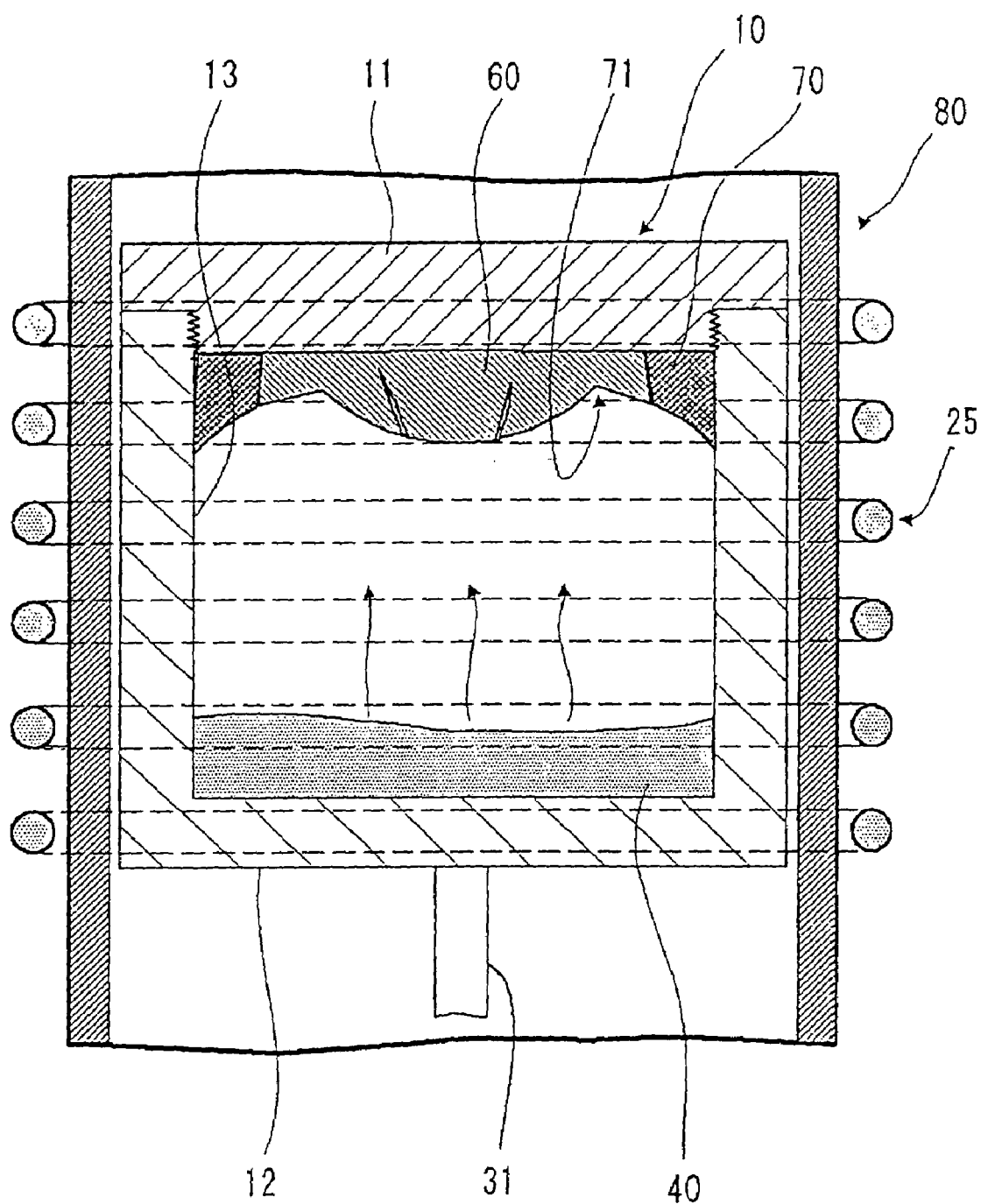
FIG. 8 is a schematic view for illustrating a condition in which a silicon carbide single crystal is being produced by a conventional method of producing a silicon carbide single crystal.
Figure 9:
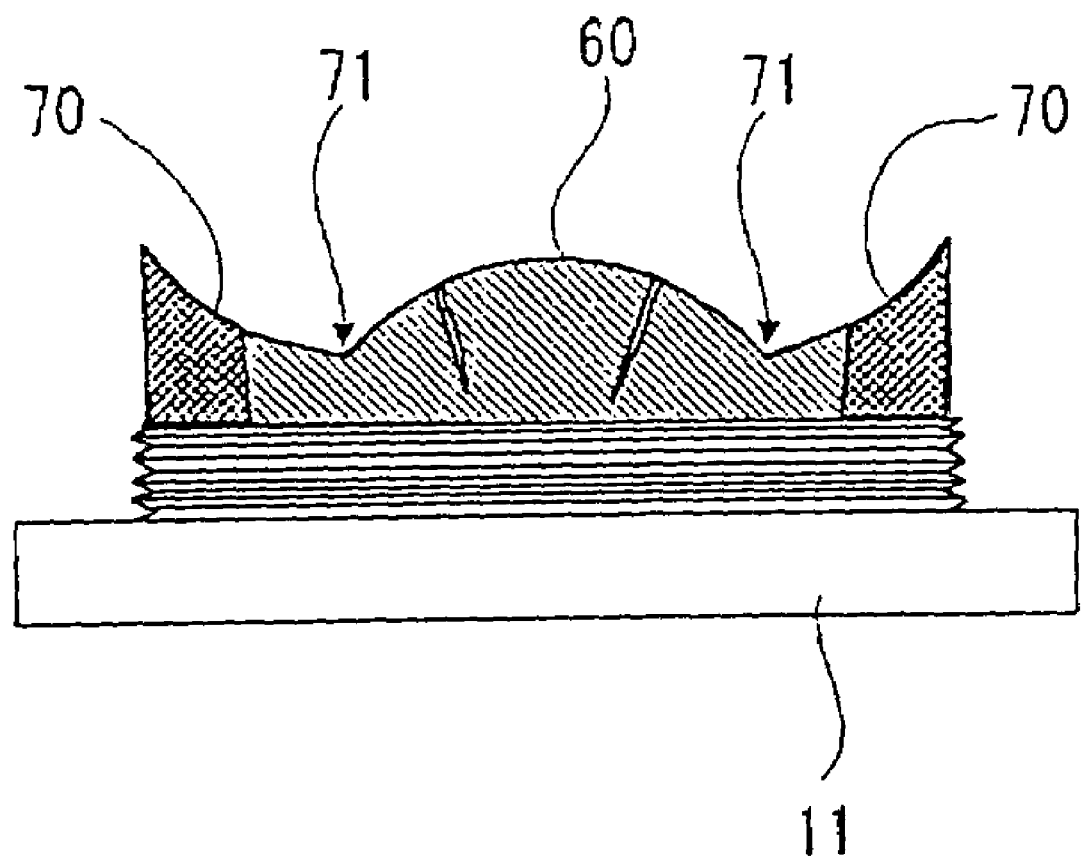
FIG. 9 is a schematic view of a silicon carbide single crystal produced by a conventional method of producing a silicon carbide single crystal.

In Comparative Example 1, the whole surface of the side facing the inside of the vessel body 12, in the cover body 11, was, covered with a crystal of silicon carbide, and a silicon carbide single crystal 70 grew on the outer periphery of the cover body 11 contacting the inner peripheral surface of the vessel body 12, as shown in FIG. 8. When cooling was conducted to room temperature under this condition, stress based on a difference in thermal expansion is applied in concentration from the silicon carbide polycrystal 70 side to the silicon carbide single crystal 60 side, and defects such as cracking and the like occurred on the silicon carbide single crystal 60, as shown in FIG. 8.

It will be understood by those skilled in the art that the examples described above are preferable embodiments of the present invention, and a lot of variations and modifications can be carried out without violating the spirit and range of this invention.

According to the present invention, a high quality silicon carbide single crystal excellent in dielectric breakdown property, heat resistance, radiation resistance and the like, particularly suitably for electronic devices such as semiconductor wafers and the like and optical devices such as light emitting diodes and the like, and showing no defects such as contamination of polycrystals and polymorphs and micropipes and the like, and a method and an apparatus capable of generating the above-mentioned high quality silicon carbide single crystal with large diameter efficiently and easily without breakages such as cracking and the like, can be provided.

What is claimed is:

1. A method of producing a silicon carbide single crystal in which a sublimation raw material being sublimated is re-crystallized to grow a silicon carbide single crystal, comprising growing the silicon carbide single crystal while maintaining the whole growing surface in a convex shape throughout all growth processes.

2. The method of producing a silicon carbide single crystal according to claim 1, wherein a crystal of silicon carbide containing a silicon carbide single crystal is grown approximately in a protruded shape.

3. The method of producing a silicon carbide single crystal according to claim 1, comprising
growing the crystal of silicon carbide containing a silicon carbide single crystal while maintaining the approximate protruded shape and,
wherein the diameter of the crystal of silicon carbide decreases gradually toward the sublimation raw material throughout all the growth processes.

4. The method of producing a silicon carbide single crystal according to claim 1, further comprising
accommodating the sublimation raw material in a reaction vessel,
placing a seed crystal of a silicon carbide single crystal at an end approximately facing the sublimation raw material in the reaction vessel, and
conducting the growth of the crystal of silicon carbide containing a silicon carbide single crystal only in a region excluding a part adjacent to a peripheral side surface part in the reaction vessel.

5. The method of producing a silicon carbide single crystal according to claim 2,
wherein the crystal of silicon carbide containing a silicon carbide single crystal is composed only of a silicon carbide single crystal.

6. The method of producing a silicon carbide single crystal according to claim 1, further comprising
accommodating a sublimation raw material at one end side in a reaction vessel, and placing a seed crystal of a silicon carbide single crystal at another end side in the reaction vessel;
forming a sublimation atmosphere by a first heating means placed at the one end side so as to enable sublimation of the sublimation raw material;
forming a re-crystallization atmosphere by a second heating means placed at another end side so that the sublimation raw material being sublimate by the first heating means is re-crystallizable only in the vicinity of the seed crystal of a silicon carbide single crystal, and the sublimation raw material is re-crystallized on the seed crystal of a silicon carbide single crystal.

7. The method of producing a silicon carbide single crystal according to claim 6, wherein the temperature of the re-crystallization atmosphere is lower than the temperature of the sublimation atmosphere by 30 to 300° C., in the reaction vessel.

8. The method of producing a silicon carbide single crystal according to claim 6,
wherein the first heating means and the second heating means are an induction-heatable coil.

9. The method of producing a silicon carbide single crystal according to claim 8, wherein the current value of the induction heating current in the first heating means is larger than the current value of the induction heating current in the second heating means.

10. The method of producing a silicon carbide single crystal according to claim 8,
wherein the current value of the induction heating current in the second heating means is decreased continuously or gradually with the increase of the diameter of a growing silicon carbide single crystal.

11. The method of producing a silicon carbide single crystal according to claim 6,
wherein if the temperature at one end side accommodating a sublimation raw material is represented by $T_1$ and the temperature at another end side at which a seed crystal of a silicon carbide single crystal is placed is represented by $T_2$, in the reaction vessel, and the temperature of the part adjacent to the inner peripheral side surface part of the reaction vessel at said another end side is represented by $T_3$, then, $T_3-T_2$ and $T_1-T_2$ increase continuously or gradually.

12. The method of producing a silicon carbide single crystal according to claim 8,
wherein an interference preventing means capable of flowing the induction current and preventing interference between the first heating means and the second heating means by flowing the induction current is placed between the first heating means and the second heating means.

13. The method of producing a silicon carbide single crystal according to claim 12, wherein the interference preventing means is a coil through which cooling water can flow.

14. The method of producing a silicon carbide single crystal according to claim 6, wherein the one end is a lower end and another end is an upper end.

15. The method of producing a silicon carbide single crystal according to claim 6, wherein the reaction vessel is a crucible placed in a quartz tube.

16. The method of producing a silicon carbide single crystal according to claim 6,
wherein a first region in which a silicon carbide single crystal is grown and a second region situated at the outer periphery of the first region and adjacent to the inner peripheral side surface part of the reaction vessel, at another end, are formed from different members, and one end of the member forming the first region in which a silicon carbide single crystal is grown is exposed to the inside of the reaction vessel and another end thereof is exposed to the outside of the reaction vessel.

17. The method of producing a silicon carbide single crystal according to claim 1, wherein the surface of the part adjacent to the peripheral side surface part in the reaction vessel at another end is made of glassy carbon.

18. The method of producing a silicon carbide single crystal according to claim 1, wherein the sublimation raw material is a silicon carbide powder obtained by
using as a silicon source at least one compound selected from high purity alkoxysilanes and alkoxysilane polymers, as a carbon source a high purity organic compound generating carbon by heating;
uniformly mixing the silicon source and the carbon source to obtain a mixture; and
calcinating the resulted mixture by heating under a non-oxidizing atmosphere.

19. The method of producing a silicon carbide single crystal according to claim 1, wherein the sublimation raw material is a silicon carbide powder obtained by
using as a silicon source a high purity alkoxysilane, as a carbon source a high purity organic compound generating carbon by heating;
uniformly mixing the silicon source and the carbon source to obtain a mixture; and
calcinating the resulted mixture by heating under a non-oxidizing atmosphere.

20. The method of producing a silicon carbide single crystal according to claim 1, wherein the sublimation raw material is a silicon carbide powder obtained by using as a silicon source at least one of a high purity alkoxysilane and a polymer of a high purity alkoxysilane, as a carbon source a high purity organic compound generating carbon by heating;

uniformly mixing the silicon source and the carbon source to obtain a mixture; and calcinating the resulted mixture by heating under a non-oxidizing atmosphere.

21. The method of producing a silicon carbide single crystal according to claim 1, wherein the sublimation raw material is a silicon carbide powder obtained by using as a silicon source at least one compound selected from the group consisting of high purity methoxysilane, high purity ethoxysilane, high purity propoxysilane and high purity butoxysilane, as a carbon source a high purity organic compound generating carbon by heating;

uniformly mixing the silicon source and the carbon source to obtain a mixture; and calcinating the resulted mixture by heating under a non-oxidizing atmosphere.

22. The method of producing a silicon carbide single crystal according to claim 1, wherein the sublimation raw material is a silicon carbide powder obtained by using as a silicon source at least one compound selected from the group consisting of high purity methoxysilane, high purity ethoxysilane, high purity propoxysilane and high purity butoxysilane, and a polymer of them having a polymerization degree of 2 to 15, as a carbon source a high purity organic compound generating carbon by heating;

uniformly mixing the silicon source and the carbon source to obtain a mixture, and calcinating the resulted mixture by heating under a non-oxidizing atmosphere.

23. The method of producing a silicon carbide single crystal according to claim 1, wherein the sublimation raw material is a silicon carbide powder obtained by using as a silicon source at least one of compound selected from the group consisting of high purity monoalkoxysilanes, high purity dialkoxysilanes, high purity trialkoxysilanes and high purity tetraalkoxysilanes, and a polymer of them having a polymerization degree of 2 to 15, as a carbon source a high purity organic compound generating carbon by heating;

uniformly mixing the silicon source and the carbon source to obtain a mixture; and calcinating the resulted mixture by heating under a non-oxidizing atmosphere.

24. The method of producing a silicon carbide single crystal according to claim 1, wherein the silicon source is a tetraalkoxysilane polymer and the carbon source is a phenol resin.

25. The method of producing a silicon carbide single crystal according to claim 18, wherein each content of impurity elements in the silicon carbide powder is 0.5 ppm or less.

26. A silicon carbide single crystal produced by the method of producing a silicon carbide single crystal according to claim 1.

27. The silicon carbide single crystal according to claim 26, wherein the crystal defect in the form of hollow pipe of which image is optically detected is 100/cm$^2$ or less.

28. The silicon carbide single crystal according to claim 26, wherein the total content of impurity elements is 10 ppm or less.

* * * * *